US008763063B2

(12) United States Patent
Brooks et al.

(10) Patent No.: US 8,763,063 B2
(45) Date of Patent: Jun. 24, 2014

(54) CONTROLLED ISOLATION SPLITTER APPARATUS AND METHODS

(75) Inventors: Paul D. Brooks, Weddington, NC (US); Robert L. Romerein, Pontypool (CA)

(73) Assignee: Time Warner Cable Enterprises LLC, New York, NY (US)

( * ) Notice: Subject to any disclaimer, the term of this patent is extended or adjusted under 35 U.S.C. 154(b) by 1086 days.

(21) Appl. No.: 11/143,119

(22) Filed: Jun. 1, 2005

(65) Prior Publication Data

US 2005/0289632 A1    Dec. 29, 2005

Related U.S. Application Data

(60) Provisional application No. 60/576,280, filed on Jun. 1, 2004.

(51) Int. Cl.
*H04N 7/173* (2011.01)
*H04N 7/10* (2006.01)
*H04N 21/61* (2011.01)

(52) U.S. Cl.
CPC ............... *H04N 7/104* (2013.01); *H04N 21/61* (2013.01)
USPC .............. 725/129; 725/98; 725/127; 725/149

(58) Field of Classification Search
CPC ........ H04N 7/104; H04N 21/60; H04N 21/61
USPC .............. 725/127, 78–80, 85, 105, 118, 128, 725/129, 143, 148, 149, 74, 82, 109, 110, 725/98
See application file for complete search history.

(56) References Cited

U.S. PATENT DOCUMENTS

| 4,534,024 | A |   | 8/1985 | Maxemchuck et al. |
| 4,963,966 | A |   | 10/1990 | Harney et al. |
| 4,970,722 | A |   | 11/1990 | Preschutti |
| 5,737,461 | A | * | 4/1998 | Sanders et al. ................. 385/27 |
| 5,805,806 | A |   | 9/1998 | McArthur |
| 5,815,794 | A |   | 9/1998 | Williams |
| 5,881,362 | A | * | 3/1999 | Eldering et al. .............. 725/125 |
| 5,946,047 | A |   | 8/1999 | Levan |

(Continued)

FOREIGN PATENT DOCUMENTS

| TW | 96211797 | 7/1996 |
| TW | 96211798 | 7/1996 |

OTHER PUBLICATIONS

Circuit Diagram for Pulse Engineering, Inc., Part No. C6058, 8 pages.

(Continued)

*Primary Examiner* — Benjamin R Bruckart
*Assistant Examiner* — Jason Thomas
(74) *Attorney, Agent, or Firm* — Gazdzinski & Associates PC

(57) ABSTRACT

Apparatus and methods for controlled splitting and isolation of signals in a radio frequency network. In one embodiment, the network comprises a cable television network, and the apparatus comprises a signal splitter having controlled isolation loss at its output ports in at least one frequency band, thereby enabling communications between terminal devices at the subscriber premises that would otherwise be isolated by high losses typical of prior art splitters. The splitter apparatus can also be utilized with a filter/reflector circuit that advantageously provides maximal downstream frequency spectrum bandwidth while suitably reflecting the aforementioned communications to maintain them within the subscriber-side network without interference.

15 Claims, 12 Drawing Sheets

(56) References Cited

U.S. PATENT DOCUMENTS

| | | | |
|---|---|---|---|
| 5,999,796 A * | 12/1999 | Tresness et al. | 725/125 |
| 6,049,693 A | 4/2000 | Baran | |
| 6,181,777 B1 | 1/2001 | Kiko | |
| 6,188,750 B1 | 2/2001 | Kiko | |
| 6,205,138 B1 | 3/2001 | Nihal et al. | |
| 6,212,259 B1 | 4/2001 | Kiko | |
| 6,266,816 B1 * | 7/2001 | Watson et al. | 725/120 |
| 6,348,837 B1 | 2/2002 | Ibelings | |
| 6,404,347 B1 | 6/2002 | Kiko | |
| 6,472,992 B1 | 10/2002 | Kiko | |
| 6,481,013 B1 * | 11/2002 | Dinwiddie et al. | 725/80 |
| 6,563,801 B2 | 5/2003 | Makinen et al. | |
| 6,574,236 B1 * | 6/2003 | Gosselin et al. | 370/465 |
| 6,622,304 B1 * | 9/2003 | Carhart | 725/74 |
| 6,637,030 B1 | 10/2003 | Klein | |
| 6,637,033 B1 | 10/2003 | Cloonan et al. | |
| 6,643,566 B1 | 11/2003 | Lehr et al. | |
| 6,834,607 B1 | 12/2004 | Johnson | |
| 6,941,576 B2 | 9/2005 | Amit | |
| 7,012,885 B1 | 3/2006 | Lee | |
| 7,110,931 B2 | 9/2006 | Cotant et al. | |
| 7,138,886 B2 * | 11/2006 | Strull et al. | 333/109 |
| RE39,432 E | 12/2006 | Kiko | |
| 7,209,497 B2 | 4/2007 | Weinsteis | |
| 7,266,726 B1 | 9/2007 | Ladd | |
| RE40,020 E | 1/2008 | Kiko | |
| 7,533,403 B1 * | 5/2009 | Krein et al. | 725/74 |
| 2002/0059619 A1 | 5/2002 | Lebar | |
| 2002/0069417 A1 | 6/2002 | Kliger et al. | |
| 2002/0083476 A1 | 6/2002 | McNamara | |
| 2002/0166124 A1 * | 11/2002 | Gurantz et al. | 725/78 |
| 2003/0066082 A1 * | 4/2003 | Kliger et al. | 725/80 |
| 2003/0217365 A1 | 11/2003 | Caputo | |
| 2004/0068739 A1 | 4/2004 | Russ et al. | |
| 2004/0068747 A1 * | 4/2004 | Robertson et al. | 725/98 |
| 2004/0068753 A1 * | 4/2004 | Robertson et al. | 725/126 |
| 2004/0104786 A1 * | 6/2004 | Shafer | 333/132 |
| 2004/0107445 A1 * | 6/2004 | Amit | 725/127 |
| 2005/0005287 A1 | 1/2005 | Claussen | |
| 2005/0114900 A1 | 5/2005 | Ladd | |
| 2005/0283815 A1 | 12/2005 | Brooks | |
| 2009/0083819 A1 * | 3/2009 | Robertson et al. | 725/118 |

OTHER PUBLICATIONS

Circuit Diagram for Pulse Engineering, Inc., Part No. C6014, 8 pages.
Circuit Diagram for Pulse Engineering, Inc., Part No. CX6077, 8 pages.
Circuit Diagram for Pulse Engineering, Inc., Part No. C6039S, 8 pages.
Circuit Diagram for Pulse Engineering, Inc., Part No. C8010NL, 9 pages.

* cited by examiner

4-OUTPUT CONTROLLED ISOLATION SPLITTER

CONTROLLED ISOLATION SPLITTER APPARATUS AND METHODS

PRIORITY AND RELATED APPLICATIONS

This application claims priority to U.S. Provisional Application Ser. No. 60/576,280 filed Jun. 1, 2004 and entitled "APPARATUS AND METHODS FOR NETWORK SPECTRUM MANAGEMENT", which is incorporated herein by reference in its entirety. This application is also related to U.S. patent application Ser. No. 11/143,120 filed contemporaneously herewith and entitled "APPARATUS AND METHODS FOR NETWORK INTERFACE AND SPECTRUM MANAGEMENT", also incorporated herein by reference in its entirety.

COPYRIGHT

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

FIELD OF INVENTION

The present invention relates generally to the field of networks such as those adapted for distributing content, and specifically in one exemplary aspect to the control and utilization of the radio frequency (RF) spectrum and other signals on a cable network.

DESCRIPTION OF THE RELATED TECHNOLOGY

Radio frequency (RF) networks, such as those used based on coaxial cable and optical fiber transmission infrastructure (so-called "hybrid fiber-coax" or HFC networks) are well known in the prior art. Such networks are used, for example, to deliver residential cable television services. A portion of the network (typically closer to the core or head-end) utilizes optical fiber to transmit data and content, and at certain distribution points or hubs within the network, these optical signals are transformed into electromagnetic or radio frequency signals for transmission over the installed base of coaxial cable to the subscriber's premises.

Coaxial cable provides a transmission medium for Radio Frequency signals that maintains a constant impedance (effectively, the balance of resistance, inductance and capacitance) along its length and contains the electromagnetic energy within its structure so it can be directed to specific destinations within the network. A constant impedance is conducive to the efficient propagation of radio waves without reflection. Abrupt changes in the impedance cause a portion of the power to be reflected. Losses due to this phenomenon are known as reflection losses or return losses. The power loss associated with signal transmission along the cable is due to the absorption of a fraction of the power by the dielectric material in the core of the cable. This power loss is greater as the frequency of the signal increases, and is commonly referred to as transmission loss or insertion loss.

As is well known, a filter is a device in a signal path that selectively attenuates certain frequencies in the available spectrum. There are four basic types of filters: (i) low-pass filters attenuate all frequencies above the cut-off frequency; (ii) high-pass filters attenuate all; frequencies below the cut-off frequency; (iii) band-pass filters attenuate all frequencies except those in the pass-band; and (iv) band-stop filters attenuate only those frequencies in the stop-band. Numerous different configurations of discrete and/or integrated components are known in implementing these filters, such configurations being well known to those of ordinary skill in the electronic arts.

Signal frequencies that are in the attenuation bands of the foregoing filters are not allowed to pass through the filter (at least at any significant signal level). Instead, most of the signal is reflected back from the filter-input port.

As signals propagate through a coaxial cable network, losses due to transmission through cable and passive devices reduce the useable signal level. Signal receivers such as television sets and other consumer premises equipment (CPE) require a certain signal power to assure proper performance (e.g., a clear picture that is free from noise). RF amplifiers are used to increase the signal power at any point in the network to maintain a proper signal-to-noise ratio (SNR) or carrier-to-noise ratio (CNR). Amplification is generally directional, meaning that signals propagating toward the input of the amplifier are increased at the output but signals propagating toward the output of the amplifier (i.e., in reverse) are attenuated at the input.

A signal path in a coaxial network may be split into two or more separate paths through the use of passive splitters. Splitters may also be used to combine multiple signal paths into one path. These devices divide the total signal power at the input between the various output ports while preserving the characteristic impedance of the network to minimize reflection loss as the paths are split. As a result, the output ports are isolated from each other. This means that signals entering the output ports encounter much more attenuation in any paths to an adjacent output port than is encountered in the path to the input port.

It is also desirable to match the impedance at any port of a coaxial device to the impedance of the cable so as to minimize the chance of reflections, which can interfere with the primary signal stream. Reflections that are out of phase with the primary signal stream can cause "ghosts" in analog-modulated signals or data recognition errors in digital signals.

Various types of consumer premises equipment (CPE) are used in coaxial cable (e.g., RF/HFC) networks, the most ubiquitous being the well known set-top box (STB). The STB (and its digital cousin, the DSTB) include a radio frequency receiver and related components adapted to receive the signals carried over the coaxial portion of the network, demodulate them, decrypt them as necessary, and extract the transmitted content for viewing, recording, etc. by the subscriber.

STBs may also communicate with one another in a given premises. A subscriber node is a private radio frequency network within the subscriber's premise. The interface between the public (MSO) network and this private premises network is known as the demarcation point. Typically, such STB to STB communication is performed by reflecting signals off of a device such as the aforementioned splitter that is installed at the demarcation point of the premises (or nearby). Signals are simultaneously reflected in two or more separate frequency bands; one band is used for reverse (primarily control signal) transmission, and another band is used for forward (primarily digital video) transmission. One significant disability with this approach, however, is that the forward transmission reflector-filter prevents desired digital video signals in adjacent frequency bands from entering the premises, thereby restricting the spectrum available for revenue-producing programming. This is in effect throwing away perfectly usable bandwidth that could be otherwise utilized to carry content or other signals/data.

One prior art approach to demarcation point reflection and filtration is the Multi-Room Digital Video Recorder (MR-DVR) manufactured by Scientific-Atlanta. This device comprises a Splitter Isolation Module (SIM) which reflects both forward and reverse signals, and does not contain amplifier circuitry or power passing circuitry. The SIM operates on the principle of reflection, and employs a band-stop filter in the forward direction and a high pass filter in the reverse direction. The forward band-stop filter provides the needed blocking function, and the device does not pass power to the STB.

A variety of other approaches to signal splitting, subscriber node networking and signal reflection/filtration in content-based networks (such as the aforementioned HFC cable network) are known in the prior art.

For example, U.S. Pat. No. 4,534,024 to Maxemchuk, et al. issued on Aug. 6, 1985 and entitled "System and method for controlling a multiple access data communications system including both data packets and voice packets being communicated over a cable television system" discloses a communications system and method for controlling both digital voice traffic and digital data traffic including a communications path, a source station and a destination station. The source and destination stations are respectively adapted to be coupled to a source station home network and to a destination station home network. The source station is further adapted to transmit a signaling packet on a first transmit control channel. The signaling packet is for signaling a destination station that the source station has an information packet intended for the destination station. The destination station is adapted to detect the signaling packet on a second receive control channel. The signaling packet includes a field for identifying the source station which has the information packet intended for the destination station. In response to the signaling packet, the destination station is coupled to the source home network. Thereafter, information packets may be transmitted from the source station on a third control channel and then be translated to a source station home network channel for transmission to the destination station.

U.S. Pat. No. 4,963,966 to Harney, et al. issued Oct. 16, 1990 entitled "CATV distribution system, especially adapted for off-premises premium channel interdiction" discloses equipment for use in CATV lines and a system for distribution of CATV signals and for power to operate CATV line equipment having active devices which require power is described. The system distributes CATV signals to subscribers who have ordered different levels of service (basic service without premium channels or different groups of premium channels). Housings are located in proximity to the premises of both actual subscribers and potential subscribers, and have like covers which contain tapping electronics (a directional coupler, line equalizers and power bypassing circuit). The cover has ports at opposite ends and an additional port at one end. Different enclosure units are attached to the cover and are configured and equipped with different types of electronics depending upon the level of service and/or the technology used to control the transmission of the CATV signals in accordance with the level of service for particular subscribers. A larger enclosure unit contains interdiction electronics which is addressable by signals from the head end of the CATV system to control frequency agile oscillators which generate the signals for jamming selected premium channels. A smaller enclosure unit contains the splitting electronics and may contain band reject filter(s) which block transmission of premium channels not ordered by the subscribers. The housing in proximity to potential subscriber premises has an enclosure unit provided by a plate and the tapping circuits are terminated with loads simulating the subscriber loads. If desired a circuit board having a splitter may be located in the housing and connectors attached to the plate. External band reject filters may be mounted on the plate at the connectors. Power distribution along the cable is controlled by bypass circuits, containing an RF choke and switching means (a jumper) which is connected across a capacitor which blocks power (60 Hz AC) so that the power bypass circuit does not adversely affect the transmission of the RF CATV signals.

U.S. Pat. No. 4,970,722 to Preschutti issued on Nov. 13, 1990 and entitled "Broadband local area network" discloses a broadband local area network that transmits outbound signals in an outbound frequency band and inbound signals in an inbound frequency band. In one configuration, the network comprises a central hub and a plurality of nodes connected to the hub. Each of the nodes comprises a bidirectional amplifier having a fixed gain across the entire inbound and outbound bandwidth and a line balancer. The line balancer includes a variable cable simulator circuit for simulating the loss of a variable amount of coaxial cable and an equalizer circuit for equalizing the loss of a fixed amount of coaxial cable. The network also includes a plurality of remote outlet clusters. Each remote outlet cluster is connected to one of the nodes by a coaxial transmission path and comprises a fixed attenuation and a RF splitter having a plurality of outlets for connection to user devices. The number of outlets of each remote outlet cluster depends on the length of the transmission path to the node to which it is attached.

U.S. Pat. No. 5,805,806 to McArthur issued on Sep. 8, 1998 and entitled "Method and apparatus for providing interactive networking between televisions and personal computers" discloses a local area network (LAN) that supports both baseband digital LAN signals and video, including television signals originating outside the network and local video generated within the network. The network may include personal computers, television receivers, video cassette recorders, printers, and video cameras. Connection circuitry permits each device to receive both the video and the digital LAN signals through a single coaxial cable connection. The connection circuitry includes a LAN transceiver for each device in the network to enable each device to transmit, receive, and decode digital LAN signals. A computer interface enables any personal computer in the network to receive and display television signals received by the network and video generated by another computer or other device. A television interface enables any television in the network to receive and display local video output by a personal computer or other device in the network and enables the television to be used as a remote monitor for the computer.

U.S. Pat. No. 5,815,794 to Williams issued on Sep. 29, 1998 entitled "Undesirable energy suppression system in the return path of a bidirectional cable network having dynamically allocated time slots" discloses a bidirectional cable network having a signal distribution system that prevents undesirable energy in the bidirectional cable network's return path from adversely effecting the entire network. The signal distribution system a first signal transmitted in a forward path direction over the bidirectional communication path from a headend to a plurality of remote points. Signals transmitted in a return path direction are time division multiplexed on a series of cyclically reoccurring time slots where at least one of the cyclically reoccurring time slots is assigned to each of the plurality of remote points. At least one primary return gate is effective during each occurrence of the cyclically reoccurring time slots for isolating all of the plurality of remote points from accessing the network to transmit a signal in second direction except for the one of the plurality of remote points which is assigned the cyclically reoccurring time slot that is presently providing a path to transmit in the second direction from the remote point to the headend. In one embodiment each return gate services a plurality of remote points within the return gate's distribution branch. In a second embodiment each remote point has a dedicated return gate.

U.S. Pat. No. 5,946,047 to Levan issued Aug. 31, 1999 entitled "Network system for handling digital data over a TV channel" discloses a network system or terminal device which utilizes a unique modulation scheme that enables the transmission of digital data over a wireless, cable or direct broadcast satellite TV channel without disturbing quality of television signals. A digital data stream of the network, for example, is transparently transmitted in the television channel in a superfluous sideband segment of the frequency spectrum using a technique, herein called vestigial quadrature modulation (VQM) that entails substituting the vestigial sideband of a conventional television signal with a sideband of a data-encoded signal, preferably being QAM-modulated. A sufficient portion of the television sideband spectrum displaced by the substituted data signal, e.g., to at least the 7th harmonic, is preserved for deriving synchronization information that is used both for clocking the digital data from the modulated data signal and for driving vertical and horizontal synchronization circuits of the television. A receiver in a network terminal device utilizes an interface that includes a channel splitter and SAW filters in each of respective data and video channels for separately processing the video and digital data signals.

U.S. Pat. No. 6,049,693 to Baran, et al. issued on Apr. 11, 2000 entitled "Upstream ingress noise blocking filter for cable television system" discloses a plurality of intelligently-controlled frequency-domain filters or ingress noise blockers that are disposed in serial connection to coaxial cable at feeder tap locations that connect each household node to the cable. Each filter is operative in the absence of upstream signals from the local node to block ingress energy in the upstream band and is responsive to energy produced by injected upstream signals in the upstream band only from the associated local node to unblock and thus pass information signals into the upstream band. The filter employs as its blocking/unblocking mechanism an active switch whose control signal, as well as power source, is the energy of the injected upstream signal, which may be largely the information-containing signal from the associated local node which is to be gated through to the head end. The switch is able to respond quickly to microvolt level signals. The active switch is preferably a depletion-mode-type field effect transistor (FET).

U.S. Pat. No. 6,205,138 to Nihal, et al. issued Mar. 20, 2001 entitled "Broadband any point to any point switch matrix" discloses a broadband matrix switch system and method of operation. The broadband matrix switch has N number of broadband inputs, each of the broadband inputs having one or more broadband signals. The matrix switch has M number of broadband outputs. There are N numbers of splitters. Each of the splitters has a splitter input connected to one of the broadband inputs. Each of the splitters has M number of splitter outputs that produce the splitter output signal. There are N times M number of node switches. Each node switch is uniquely connected to one of the splitter outputs. The node switches have a control input that allows the node switch to pass the respective splitter output signal upon receiving a close command at the control input and to terminate the respective splitter output signal with an input impedance upon receiving an open command at the control input. There are M number of combiners. Each combiner has a combiner output connected to one of the broadband outputs. Each combiner further having N number of combiner inputs. Each of the combiner inputs are connected to one and only one of the inputs through the respective splitter and node switch. The node switches terminate the combiner input with an output impedance upon receiving an open command. The matrix switch further has a controller that sends one or more open commands to selected node switches to connect one or more of the broadband inputs to one or more of the broadband outputs. The matrix switch has many uses in switching and monitoring and analyzing broadband networks, for example, cable TV networks.

U.S. Pat. No. 6,348,837 to Ibelings issued on Feb. 19, 2002 entitled "Bi-directional amplifier having a single gain block for amplifying both forward and reverse signals" discloses an amplifier including a first terminal for receiving forward signals in a first frequency band and a second terminal for receiving reverse signals in a second frequency band. A single gain block is coupled between the first terminal and the second terminal for amplifying the forward signals and the reverse signals. The forward signals, after amplification, are provided to the second terminal for transmission from the amplifier, and the reverse signals, after amplification, are provided to the first terminal for transmission from the amplifier. In this manner, both forward and reverse signals, which are transmitted in separate frequency bands, can be amplified by a single gain block.

U.S. Pat. No. 6,563,801 to Makinen, et al. issued on May 13, 2003 entitled "Cable interface for data and power supply" discloses a cable interface unit which allows use of the same wire in one cable both for base-band transmission of data between telecommunication equipment in full duplex form and also for transmission of an operating voltage from one device to another. In the transmission unit, data is transmitted through a hybrid connection to a cable. After the hybrid connection, the operating voltage is also brought to the cable with the aid of a diplexer. The hybrid connection separates the arriving data and conducts it to the receiver, where the data is shaped in an analog manner by correcting level distortions and thereupon in the digital signal processing a decision is made on what the received symbol is.

U.S. Pat. No. 6,637,033 to Cloonan, et al. issued Oct. 21, 2003 entitled "Signal splitter and gain adjustment system for a cable data system" discloses a cable data system wherein, frequency division multiplexed upstream data traffic is first split for subsequent signal processing. In the course of performing an analog RF signal splitting operation, signal splitter output amplitude is decreased as an artifact of an RF signal splitter. A signal splitter indicator type that is used per signal splitter, provides an indication to the CMTS channel interface cards to control the amount of compensating gain required to restore the original signal to its original amplitude.

U.S. Pat. No. 6,643,566 to Lehr, et al. issued Nov. 4, 2003 entitled "System for power delivery over data communication cabling infrastructure" discloses a system for generating, delivering and distributing electrical power to network elements over a data communication network infrastructure within a building, campus or enterprise. The invention includes power/data combiners that combine a data communication signal with a low frequency power signal. The combined signal is transported over the LAN infrastructure where a power/data splitter extracts the data signal and the power signal and generates two separate outputs. The power over LAN system of the present invention operates with high bandwidth data communication networks, i.e., 10 Mbps, 100

Mbps, and 1000 Mbps. The electrical power distributed over the LAN can be delivered as DC or low frequency AC voltages which in either case will not interfere with data communications signals. The electrical power delivered over data communications cable can be transmitted using one or more spare pairs in the cable or over the receive and transmit wires.

United States Patent Application 20020069417 to Kliger, et al. published Jun. 6, 2002 entitled "Home network system and method" discloses a home network, in one embodiment including a home wiring system; a demarcation point unit in electrical communication with the home wiring system; and a home network module in electrical communication with the home wiring system. The home network module is adapted for connection to a home electronic device. The demarcation point unit passes data to and receives data from the home electronic device through the home network module.

United States Patent application 20020083476 to McNamara published Jun. 27, 2002 entitled "Method and apparatus for reducing the flow of RF noise from subscriber's premise cable systems into the reverse transmission path of two-way cable networks" discloses a method and means for reducing the RF noise induced within cable networks within residences or businesses from entering hybrid fiber optic coax networks in the reverse (upstream) direction. The active unit consists of a set of diplex filters connected end to end which segregates the RF traffic into a forward (nominally 50-750/850 MHz) and a reverse (nominally 5-30/36/42 MHz) direction but with an amplifier placed in the low band path. In the simplest embodiment, the active unit is attached directly to an Network Interface Unit (NIU). Signals from the NIU are amplified as they pass through the active unit and are then transmitted through the premise distribution network. The active unit is designed to boost the signals before they are mixed with noise present within the subscriber's premise network. At a second point in the network, typically at the side of the home where the residential premise network connects to the outside cable plant, the network passes through a second passive unit. The passive unit consists of a pair of diplex filters but on the low band path of the diplex filter pair there is an attenuator which attenuates signals in the reverse direction by nominally 15-35 dB, depending upon the value chosen for the attenuator. The attenuator may be either fixed, variable, or a combination of both. The amplified RF signal and all noise that has entered the premise network cable system in the reverse path are attenuated and then passed through to the outside cable plant.

United States Patent Application 20030066082 to Kliger, et al. published Apr. 3, 2003 entitled "Home network system and method" discloses a demarcation point unit connected between a home network backbone and an external network. The demarcation point unit includes a blocking filter and splitter. The blocking filter receives a home network signal from the home network backbone and an external signal from the external network. The blocking filter separates the home network signal from the external signal, and returns the home network signal back to the home network backbone. The splitter has an input and at least two outputs. The input of the splitter receives the home network signal from the blocking filter.

United States Patent Application 20040068739 to Russ, et al. published Apr. 8, 2004 entitled "Networked multimedia system having a multi-room interactive network guide" discloses systems and methods for providing downstream signals to a plurality of receiver networks. A receiver network (i.e., a networked multimedia system) includes a splitter/isolation module (SIM), a primary set-top terminal (STT), and at least one remote device. The remote devices communicate with the primary STT via the SIM over coaxial cable. Accordingly, the remote devices utilize some or all of the features including hardware and software that are included in the primary STT via the networked multimedia system. A network guide is provided that displays the past and present activity status of each of the receiving devices.

United States Patent Application 20040068747 to Robertson, et al. published Apr. 8, 2004 entitled "Networked multimedia system" discloses systems and methods for providing downstream signals to a plurality of receiver networks. A receiver network (i.e., a networked multimedia system) includes a splitter/isolation module (SIM), a primary set-top terminal (STT), and at least one remote device. The remote devices communicate with the primary STT via the SIM over coaxial cable. Accordingly, the remote devices utilize some or all of the features including hardware and software that are included in the primary STT via the networked multimedia system.

United States Patent Application 20050005287 to Claussen published on Jan. 6, 2005 entitled "Networked multimedia overlay system" discloses systems and methods for providing encrypted downstream signals to a plurality of receiver devices, where the devices may have different decryption devices. A receiver network (i.e., a networked multimedia system) includes a splitter/isolation module (SIM), a primary set-top terminal (STT), and at least one remote device. The remote devices communicate with the primary STT via the SIM over coaxial cable. Accordingly, the remote devices are capable of requesting and receiving stored programs via the networked multimedia overlay system. Depending upon the decryption device included in the requesting remote STT, the primary STT sends a stored program encrypted according to that decryption device.

Despite the foregoing variety of approaches, there is still a salient need for an improved splitter apparatus and methods for splitting downstream signals while still allowing premises or "subscriber node" communications to occur. Such improved apparatus would ideally be configured to permit low-isolation communications between different nodes or devices within the premises, and reflect only the reverse direction signals (which are used for, e.g., on-premise control), thereby allowing the desired forward-bound video signals into the subscriber's site. Additionally, "forward" video signals generated on-premise would be blocked from exiting the premises without the need for a specialized filter or similar components.

The improved apparatus would be comparatively simple in its construction (in order to provide low installation cost and a high degree of reliability), and would also be readily compatible with existing coaxial cable network topologies, as well as existing CPE (e.g., DSTB) implementations so as to allow retrofitting to the installed STB base if desired.

SUMMARY OF THE INVENTION

The present invention satisfies the foregoing needs by providing improved "controlled isolation" splitter apparatus and methods.

In a first aspect of the invention, improved network signal splitting apparatus is disclosed. In one embodiment, the network comprises a cable television (CATV) network, and the splitting apparatus comprises a premises device adapted to lower isolation loss in at least one frequency band of the network, thereby enabling communications between terminal devices at the premises that would otherwise be isolated by high losses. In one variant, the device comprises: a splitter sub-circuit comprising first, second and third nodes; an input port electrically coupled to the first node via a first resistive element; a first signal path comprising a first output port electrically coupled to the second node via at least one second resistive element; a second signal path comprising a second output port electrically coupled to the third node via at least one third resistive elements; a bypass circuit electrically coupled to the first path and the second path, wherein the bypass circuit comprises a plurality of circuit elements adapted to pass signals between the second and third nodes within the at least one frequency band.

In a second embodiment, the apparatus comprises: at least one input port adapted to receive an input signal from a network; a circuit operatively coupled with the at least one input port and adapted to substantially split the input signal; and a plurality of output ports operatively coupled with the circuit, respective ones of the ports at least receiving portions of the split input signal; wherein the plurality of output ports are substantially isolated from one another except over at least one specified frequency band; and wherein the plurality of output ports are adapted for signal communication with respective ones of a plurality of terminals, the terminals being able to communicate with one another over the at least one specified frequency band.

In a second aspect of the invention, a method of transmitting data signals over a network is disclosed. In one embodiment, the method comprises: propagating a first data signal from a first device onto the network and to a first output port of a splitter; and propagating the first data signal to a second device on the network via a second output port of the splitter; wherein the splitter is configured to provide reduced isolation loss between the second output port and the first output port in at least one frequency band.

In a third aspect of the invention, a passive broadband coaxial network architecture is disclosed. In one embodiment, the architecture comprises: a controlled isolation splitter having an input port and at least first and second output ports; a signal splitter in signal communication with the first output port, the signal splitter having a plurality of output ports and being operative to split signals transmitted via the one output port; a plurality of terminal devices. At least a first one of the terminal devices is electrically coupled to the second output port of the controlled isolation splitter, and at least a second one of the terminal devices is electrically coupled to one of the output ports of the signal splitter. The controlled isolation splitter is operative to permit communications between the first and second terminal devices by providing reduced isolation loss in at least one frequency band between the first and second output ports.

In a fourth aspect of the invention, a method for providing subscriber-side networking capability is disclosed. In one embodiment, the network comprises a cable network having a public portion, subscriber-side network, and a demarcation point, and the method comprises: passing first signals within a first frequency band, the first signals traveling towards the demarcation point within the subscriber-side network; substantially attenuating second signals within a second frequency band, the second signals also traveling towards the demarcation point within the subscriber-side network; and passing the first signals when they are traveling away from the demarcation point. The first signals are utilized at least in part to provide communications between individual nodes within the subscriber-side network.

BRIEF DESCRIPTION OF THE DRAWINGS

The above and other features and advantages of the present invention are hereinafter described in the following detailed description of illustrative embodiments to be read in conjunction with the accompanying drawings and figures, wherein:

FIG. 3c is a graphical representation of the electrical performance of the four output port Controlled Isolation Splitter (CIS) of FIG. 2a.

DETAILED DESCRIPTION OF THE INVENTION

Figure 1:
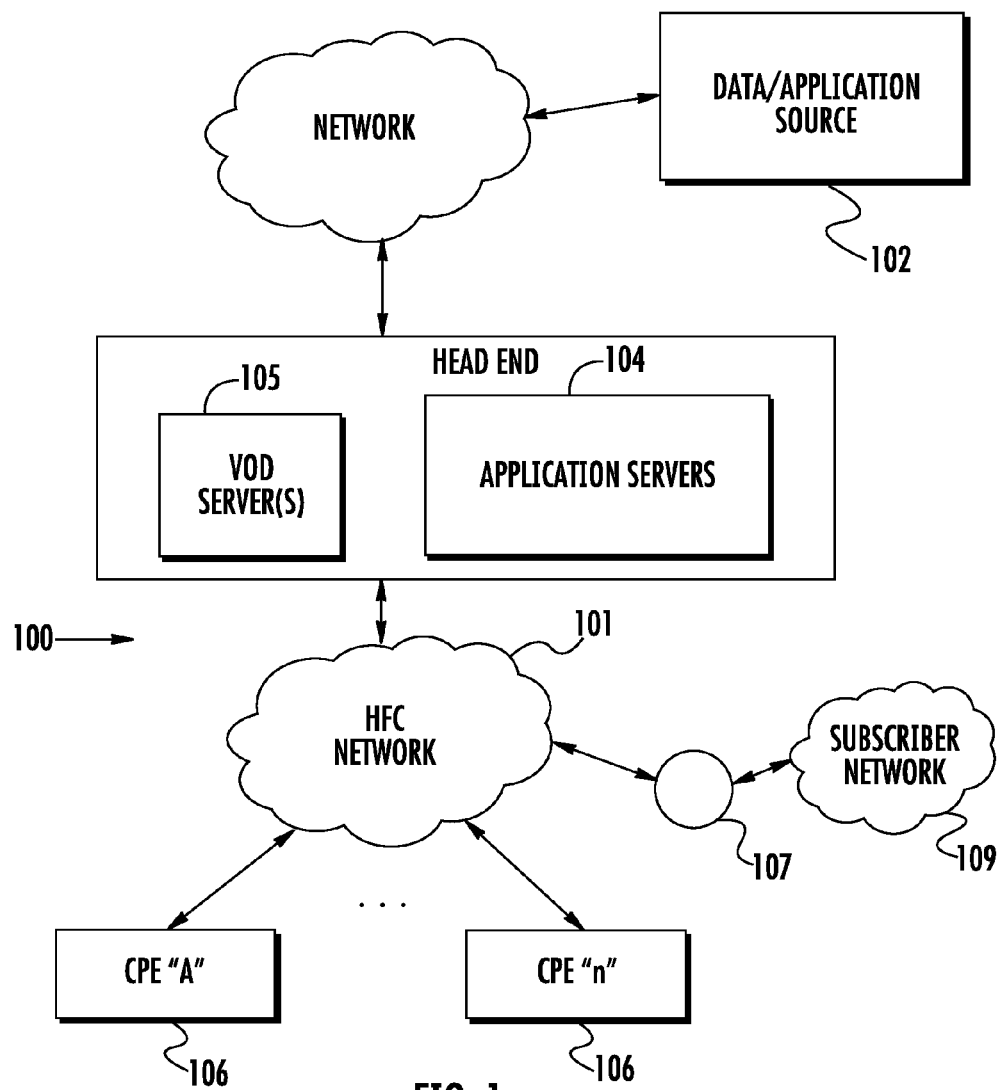
FIG. 1 is a functional block diagram illustrating an exemplary HFC network configuration useful with the present invention.

Reference is now made to the drawings wherein like numerals refer to like parts throughout.

As used herein, the terms "network" and "bearer network" refer generally to any type of telecommunications or data network including, without limitation, hybrid fiber coax (HFC) networks, satellite networks, telephony networks, and data networks (including MANs, WANs, LANs, WLANs, internets, and intranets). Such networks or portions thereof may utilize any one or more different topologies (e.g., ring, bus, star, loop, etc.), transmission media (e.g., wired/RF cable, RF wireless, millimeter wave, optical, etc.) and/or communications or networking protocols (e.g., SONET, DOCSIS, IEEE Std. 802.3, ATM, X.25, Frame Relay, 3GPP, 3GPP2, WAP, SIP, UDP, FTP, RTP/RTCP, H.323, etc.).

As used herein, the term "head-end" refers generally to a networked system controlled by an operator (e.g., an MSO or multiple systems operator) that distributes programming to MSO clientele using client devices. Such programming may include literally any information source/receiver including, inter alia, free-to-air TV channels, pay TV channels, interactive TV, and the Internet. DSTBs may literally take on any configuration, and can be retail devices meaning that consumers may or may not obtain their DSTBs from the MSO exclusively. Accordingly, it is anticipated that MSO networks may have client devices from multiple vendors, and these client devices will have widely varying hardware capabilities. Multiple regional head-ends may be in the same or different cities.

As used herein, the terms "client device" and "end user device" include, but are not limited to, personal computers (PCs) and minicomputers, whether desktop, laptop, or otherwise, set-top boxes such as the Motorola DCT2XXX/5XXX and Scientific Atlanta Explorer 2XXX/3XXX/4XXX/6XXX/8XXX series digital devices, personal digital assistants (PDAs) such as the Apple Newton®, "Palm®" family of devices, handheld computers such as the Hitachi "VisionPlate", personal communicators such as the Motorola Accompli devices, Motorola EVR-8401 J2ME equipped devices, cellular telephones, or literally any other device capable of interchanging data with a network.

Similarly, the terms "Consumer Premises Equipment (CPE)" and "host device" refer to any type of electronic equipment located within a consumer's or user's premises and connected to a network. The term "host device" refers generally to a terminal device that has access to digital television content via a satellite, cable, or terrestrial network. The host device functionality may be integrated into a digital television (DTV) set. The term "consumer premises equipment" (CPE) includes such electronic equipment such as set-top boxes, televisions, Digital Video Recorders (DVR), gateway storage devices (Furnace), and ITV Personal Computers.

As used herein, the term "network agent" refers to any network entity (whether software, firmware, and/or hardware based) adapted to perform one or more specific purposes. For example, a network agent may comprise a computer program running in server belonging to a network operator, which is in communication with one or more processes on a CPE or other device.

As used herein, the term "server" refers to any computerized component, system or entity regardless of form which is adapted to provide data, files, applications, content, or other services to one or more other devices or entities on a computer network.

As used herein, the term "computer program" is meant to include any sequence or human or machine cognizable steps which perform a function. Such program may be rendered in virtually any programming language or environment including, for example, C/C++, Fortran, COBOL, PASCAL, assembly language, markup languages (e.g., HTML, SGML, XML, VoXML), and the like, as well as object-oriented environments such as the Common Object Request Broker Architecture (CORBA), Java™ (including J2ME, Java Beans, etc.) and the like.

As used herein, the terms "resistor" and "resistive element" refer generally to any signal conditioning or electrical component or device regardless of form, which provides a substantially real (non-imaginary) impedance. Examples of resistive elements include, without limitation, chip resistors, axial resistors, copper traces, and wire. Such resistors or resistive elements may be discrete devices, or integrated with other devices (such as within a semiconductor or integrated circuit device).

As used herein, the terms "capacitor" and "capacitive element" refer generally to any signal conditioning or electrical component or device regardless of form, which provides a capacitance or substantially negative complex impedance. Examples of capacitive elements are chip capacitors, leaded capacitors, and any set of conductive elements separated by a dielectric material with the ability to store charge. Such capacitors or capacitive elements may be discrete devices, or integrated with other devices (such as within a semiconductor or integrated circuit device).

As used herein, the terms "inductor" and "inductive element" refer generally to any signal conditioning or electrical component or device regardless of form, which provides an inductance or substantially positive complex impedance. Examples of inductive elements are chip inductors, wound toroids, "E" cores or the like, air coils, copper traces and wires or any other conductor in which an electromotive force is induced as the result of a changing magnetic flux. Such inductors or inductive elements may be discrete devices, or integrated with other devices (such as within a semiconductor or integrated circuit device).

Overview

In one exemplary aspect, the present invention comprises a controlled isolation splitter apparatus and methods that enable broadband RF signals (such as, e.g., those present in a cable distribution system) to be transmitted within the subscriber's premises from any terminal or client device to any other terminal or client device, in one or more specific frequency band(s). Such communication between terminal devices is normally prevented (or at least made very difficult) under prior art approaches due primarily to the purposefully-engineered high isolation loss of standard production broadband signal splitting devices. The present invention comprises a modification that can be applied to any passive splitting device to lower this isolation loss in a specific frequency band or bands, thereby enabling communications between terminal devices that would otherwise be isolated by high losses. In one embodiment, this is accomplished by having the network contain only passive (non-power consuming) splitting devices and cable.

Broadband signals can flow freely when traversing a passive network in the upstream direction only, or in the downstream direction only. As signals travel from one terminal to another, there is one passive splitting device location where the signals must change from the upstream direction to the downstream direction. In the exemplary configuration, the present invention locates modified or reconfigured splitting devices where the aforementioned signal direction change is needed. Advantageously, the number of such modified devices within the network will never exceed the number (N) of terminals where communication is desired minus one, or N−1.

If more than one viable signal path exists between any two terminal devices, signal interference will be experienced. Therefore, this situation must be prevented for effective communications to occur. To insure that there is only one viable signal path between two communicating terminals, the reflection performance (return loss) of the output ports of the modified device of the present invention is purposely designed to be sufficiently higher than the isolation loss of that device at the specified frequency band(s).

The modification provided by the present invention over the prior art generally involves the application of a band-pass filter (or equivalent) functionality. This filter allows the passive splitting device to operate as a standard equivalent splitting device at all frequencies other than the specifically chosen lowered isolation band(s).

Exemplary applications of this capability include residential CPE-to-CPE (e.g., set-top to set-top) video transmission. In particular, if a set-top device has stored programs or applications, other set-tops in communication therewith can control and view these programs using the present invention. Other device-to-device communication needs using existing broadband coaxial wiring will also benefit from this invention.

Methods of doing business relating to the enhanced functionality of the splitter apparatus, including subscriber installation, are also disclosed.

Detailed Description of Exemplary Embodiments

Exemplary embodiments of the methods and apparatus of the invention are now described in detail with reference to FIGS. 1 through 4d. While these exemplary embodiments are described in the context of HFC or similar cable networks used to supply residential or other subscriber premises, the general principles and apparatus of the invention may be extended to other types of architectures and networks, whether broadband, narrowband, or otherwise, the following therefore being merely exemplary in nature.

It will also be appreciated that while described generally in the context of a residential or home domain, the present invention may be readily adapted to other types of environments (e.g., commercial/enterprise, government/military, etc.) as well.

Furthermore, while described primarily in the context of CATV networks operating in the MHz range (and various sub-bands therein), it will be appreciated that the apparatus and methodologies of the invention may be adapted to literally any frequency range.

As is well known, coaxial cable provides a transmission medium for Radio Frequency signals that maintains a substantially constant impedance (the balance of resistance, inductance and capacitance) along its length and contains the electromagnetic energy within its structure so it can be directed to specific destinations. This constant impedance is conducive to the efficient propagation of radio waves without reflection. Abrupt changes in the impedance cause a portion of the power to be reflected. This is known as reflection loss or return loss. The power loss associated with signal transmission along the cable is due to the absorption of a fraction of the power by the dielectric material in the core of the cable. This power loss is greater as the frequency of the signal increases and is known as transmission loss or insertion loss.

As signals propagate through a coaxial cable network, losses due to transmission through cable and passive devices reduce the useable signal level. Signal receivers such as television sets require a certain signal power to assure a clear picture that is free from noise. RF amplifiers are used to increase the signal power at any point in the network to maintain a proper signal to noise ratio. Amplification is directional. This means that signals propagating toward the input of the amplifier are increased at the output but signals propagating toward the output of the amplifier are attenuated at the input.

A signal path in a coaxial network may be split into two or more separate paths through the use of passive splitters. Splitters may also be used to combine multiple signal paths into one path. These devices divide the total signal power at the input between the various output ports while preserving the characteristic impedance of the network to minimize reflection loss as the paths are split. As a result, the output ports are isolated from each other. This means that signals entering the output ports encounter much more attenuation in the paths to the adjacent output ports than they encounter to the input. It is desirable to match the impedance at any port of a coaxial device to the impedance of the cable so as to minimize the chance of reflections, which can interfere with the primary signal stream. Reflections that are out of phase with the primary signal stream can cause "ghosts" in analog-modulated signals or data recognition errors in digital signals.

System Architecture

Figure 1A:
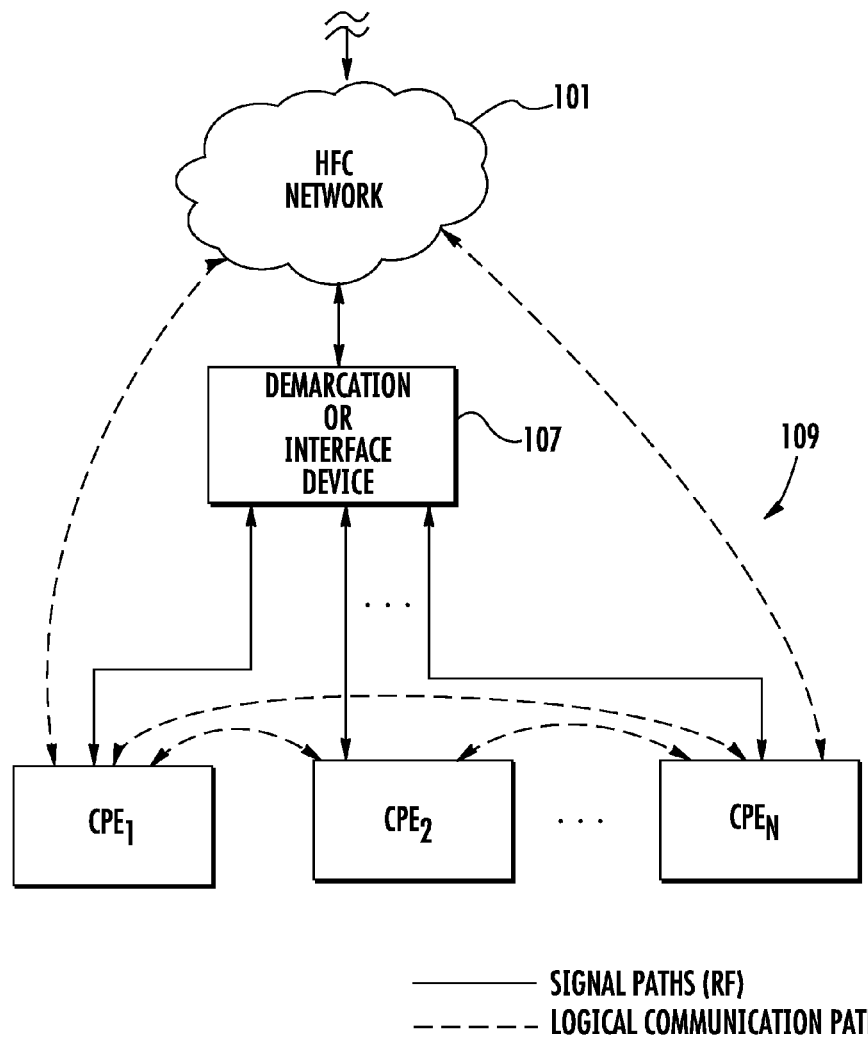
FIG. 1a is a functional block diagram illustrating an exemplary subscriber premises network which communicates with the HFC (public) network of FIG. 1.

FIGS. 1 and 1a illustrates a typical content-based network configuration within which the controlled isolation splitter (CIS) apparatus and methodology of the present invention may be used. The various components of the network 100 include (i) one or more data and application origination points 102; (ii) one or more application distribution servers 104; (iii) one or more VOD servers 105, and (iv) customer premises equipment (CPE) 106. The distribution server(s) 104, VOD servers 105 and CPE(s) 106 are connected via a bearer (e.g., HFC) network 101. A demarcation point 107 exists at the point where the HFC network 101 meets the premises network 109 (see FIG. 1a). A simple architecture comprising one of each of the aforementioned components 102, 104, 105, 106, 107, 109 is shown in FIG. 1 for simplicity, although it will be recognized that comparable architectures with multiple origination points, distribution servers, VOD servers, and/or CPE devices (as well as different network topologies) may be utilized consistent with the invention.

The application origination point 102 comprises any medium that allows an application (such as a data download application or VOD-based application) to be transferred to a distribution server 104. This can include for example an application vendor website, CD-ROM, external network interface, mass storage device (e.g., RAID system), etc. Such transference may be automatic, initiated upon the occurrence of one or more specified events (such as the receipt of a request packet or ACK), performed manually, or accomplished in any number of other modes readily recognized by those of ordinary skill.

The application distribution server 104 comprises a computer system where such applications can enter the network system. Distribution servers are well known in the networking arts, and accordingly not described further herein.

The VOD server 105 comprises a computer system where on-demand content, as well as the data (discussed in greater detail below) can be received from one or more data sources 102 and enter the network system. These sources may generate the content/data locally, or alternatively act as a gateway or intermediary from a distant source. The VOD server 105 includes the Session Resource Manager (SRM) functionality, and asks the Digital Network Control System (DNCS) for resources. The DNCS responds with negative or positive response to the request, and the VOD server implements the appropriate resource allocation logic.

The CPE 106 includes any equipment in the customers' premises (or other locations, whether local or remote to the distribution server 104) that can be accessed by a distribution server 104 or the network in general. Such CPEs 106 comprise processors and associated computer memory (and optionally mass storage) adapted to store and run the downloaded or resident application, as well as receive and store the streamed in-band content and data, such as for example in the form of a DSTB. The CPE may also comprise a local server device for a local premises network or subscriber node (e.g., LAN) that communicates over the installed cable system of the premises. This premises network makes use of the reflective and filtering capabilities of the present invention, as described in greater detail subsequently herein.

As shown in FIG. 1a, the demarcation point 107 typically comprises a device (e.g., interface circuit, splitter, reflector or the like). As described in greater detail subsequently herein, the present invention outfits this interface device 107 with a specially configured splitter (and optionally filter/reflector circuit) that provides the desired frequency spectrum functions (including allowing various nodes within the network at the premises to communicate via the output ports of the splitter), all within a simplified, low cost and spatially compact form factor.

Many other permutations of the foregoing system components and communication methods may also be used consistent with the present invention, as will be recognized by those of ordinary skill in the field. Furthermore, different network architectures may be used as well.

Controlled Isolation Splitter

Figure 2:
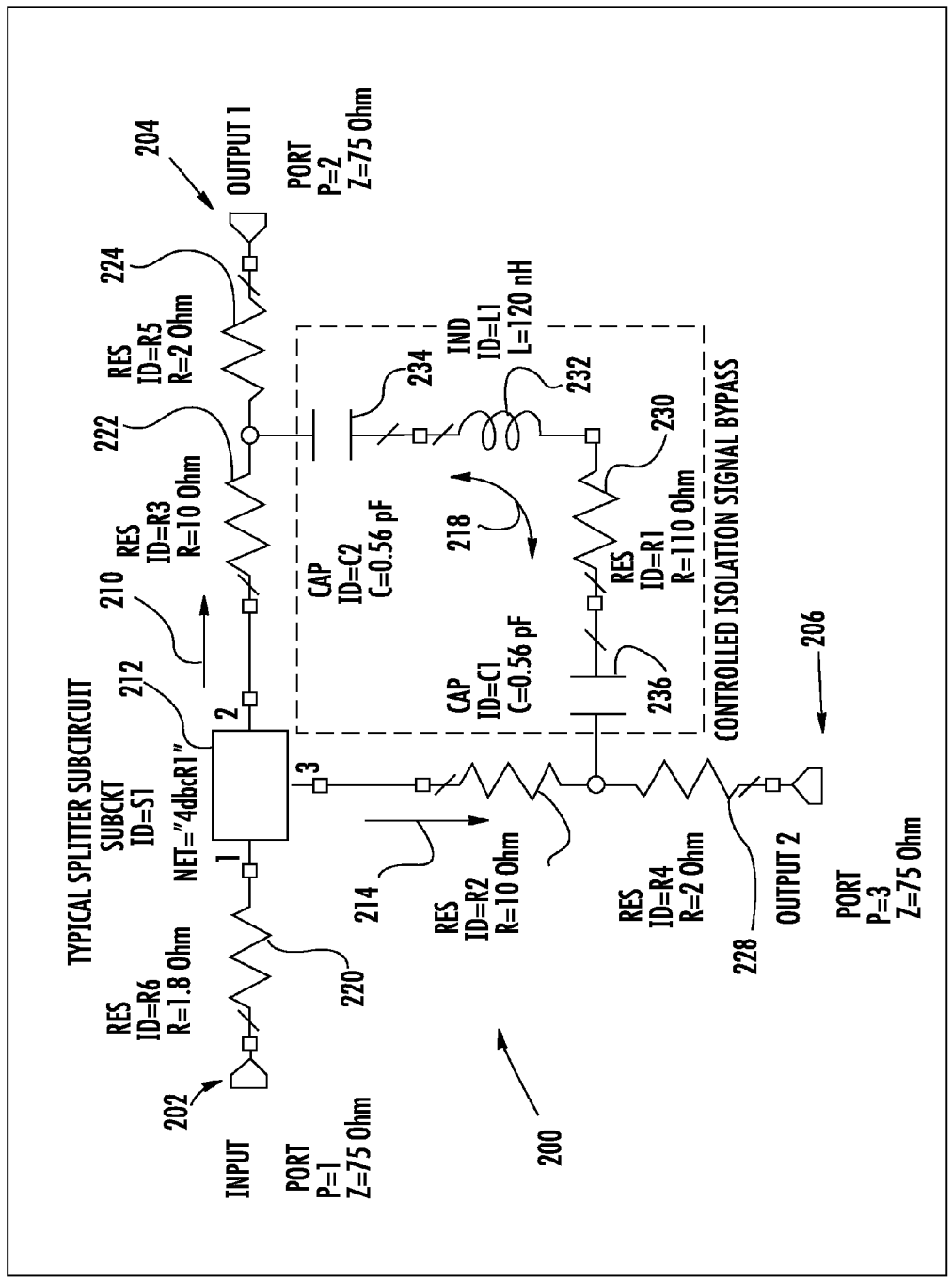
FIG. 2 is a schematic diagram of an exemplary configuration of a Controlled Isolation Splitter (CIS) circuit according to the present invention.
Figure 3A:
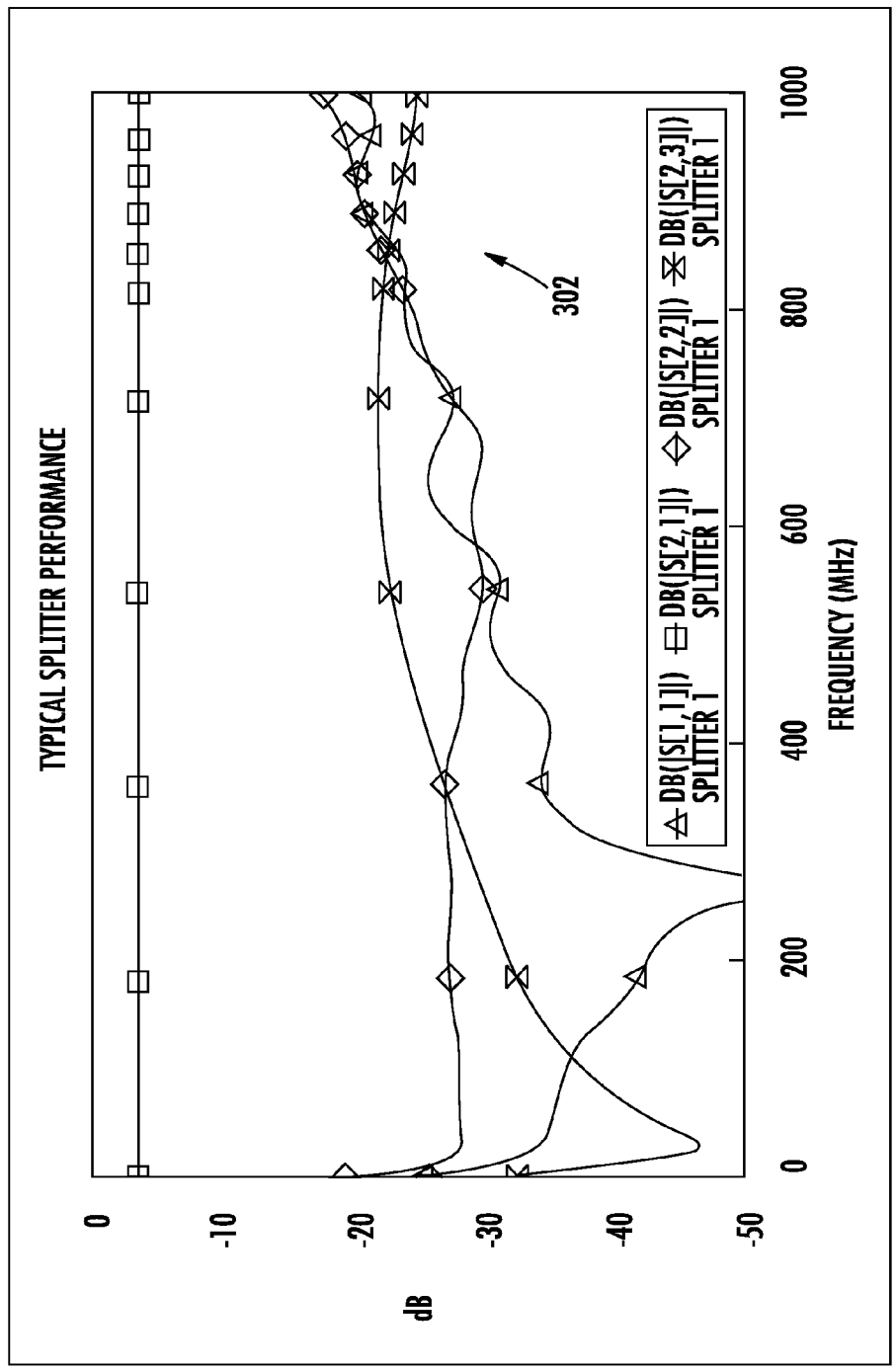
FIG. 3a is a graphical representation of the electrical performance of a typical prior art passive splitter circuit.
Figure 3B:
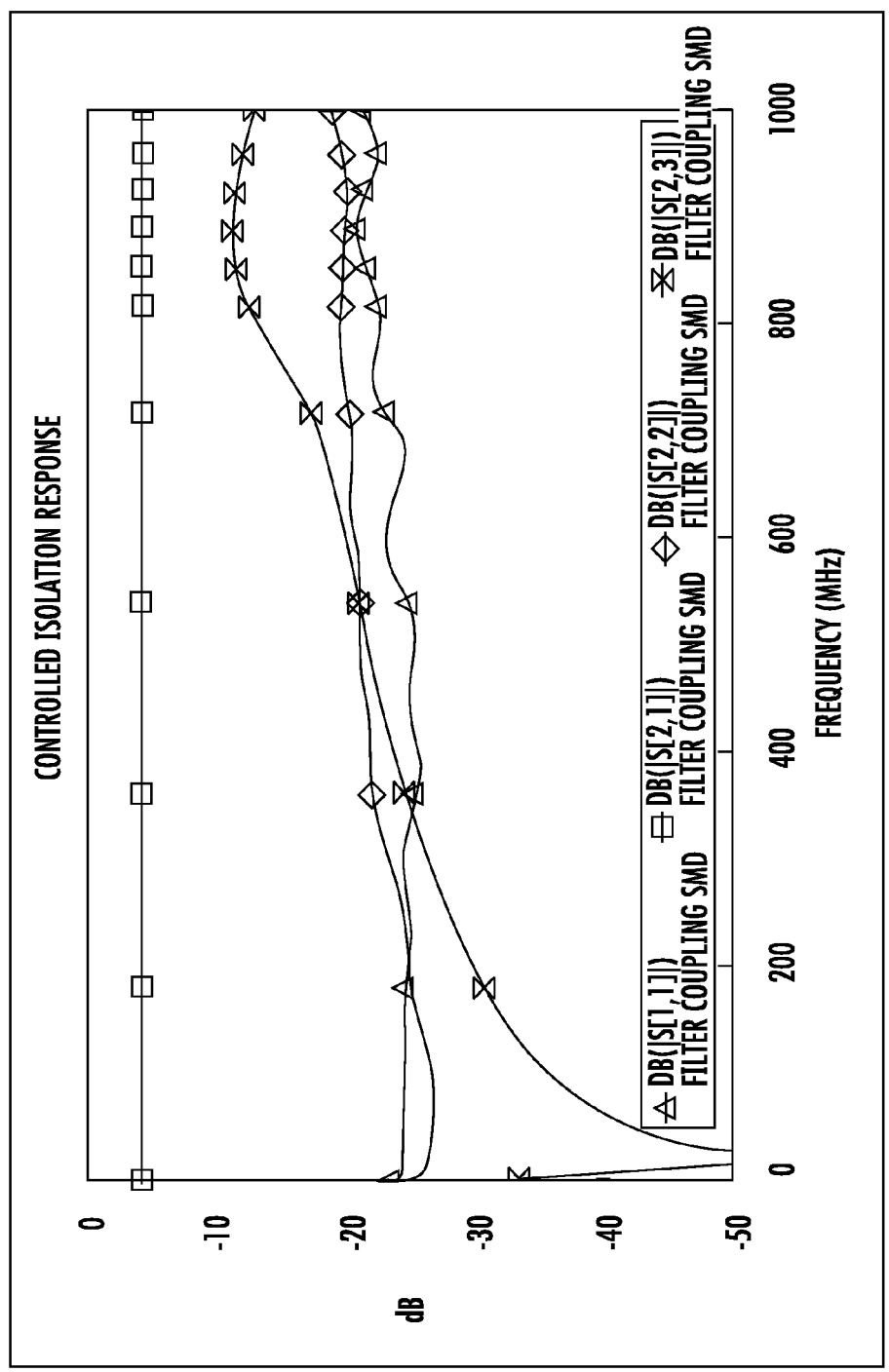
FIG. 3b is a graphical representation of the electrical performance of the Controlled Isolation Splitter (CIS) of FIG. 2, showing inter alia the reduction in isolation between 800 and 1000 MHz.

Referring now to FIGS. 2-3b, exemplary embodiments of the controlled isolation splitter (CIS) apparatus of the invention are described in detail.

The controlled isolation splitter of the present invention has been developed to address the need for a splitter that provides a "short cut" of sorts across the output ports of a passive splitter for a certain band of frequencies, without sacrificing the desirable impedance match at the ports. As is well known, such impedance matching mitigates undesired phenomena such as the partial reflection (and loss) of signals due to discontinuities in the impedance across an interface.

In the exemplary embodiment, one or more bands of frequencies (e.g., 800-1200 MHz) will find less attenuation across the output ports of the splitter than other frequencies, and yet the splitter will function normally with respect to the rest of the frequency spectrum.

A further consideration relates to blocking or attenuation of unwanted signals. Specifically, it is not desirable for cable modem signals to reach other nodes at the subscriber end of the cable network since they can cause distortions of the television signals by overloading the television receiver. Cable modems transmit high-level signals typically between 15 and 40 MHz. Therefore, high isolation is required at those frequencies across the outputs of the passive splitter(s).

One exemplary application for the controlled isolation splitter (CIS) described herein is that where a node on a branch of a coaxial network (e.g., subscriber network) may transmit signals at a frequency that is in the controlled isolation band of the splitter. Typically, these frequencies are at the upper end of the CATV spectrum between 800 and 1000 MHz. These signals may then be directed not only through the splitter output to the combined input, but also across the output ports. This makes it possible to propagate signals such as video or data to nodes connected to other output ports on the splitter that would otherwise be isolated by a high degree of attenuation.

FIG. 2 is a schematic diagram of an exemplary configuration of a Controlled Isolation Splitter (CIS) circuit 200 according to the present invention. As shown in FIG. 2, the circuit 200 comprises a substantially passive circuit having an input node (e.g., port) 202, and first and second output nodes 204, 206. Three (3) primary signal paths are present in the circuit; (i) a first path 210 from the input node 202 to the first output node 204 via a splitter sub-circuit 212; (ii) a second path 214 from the input node 202 to the second output node 206 via the splitter sub-circuit 212; and (iii) a third "bypass" path 218 between the two output nodes 204, 206. As shown in FIG. 2, the exemplary embodiment of the circuit 200 comprises an input resistor 220 (1.8 ohm), as well as first series resistors 222, 224 (10 and 2 ohm respectively) in the first path 210, and second series resistors 226, 228 (also 10 and 2 ohm respectively) in the second path 214. The bypass path 218 comprises a resistor 230 (110 ohm) in series with an inductor 232 (120 nanohenry) between two capacitors 234, 236 of 0.56 picofarad each. The fundamental operating principles of RLC circuits such as that of FIG. 2 are well understood, and accordingly not described further herein.

As described in further detail below, the "bypass" arrangement of the circuit 200 of FIG. 2 provides the unique ability for substantially unattenuated communications between the two output nodes 204, 206, without affecting other operations of the splitter in either the upstream or downstream directions.

Figure 2A:
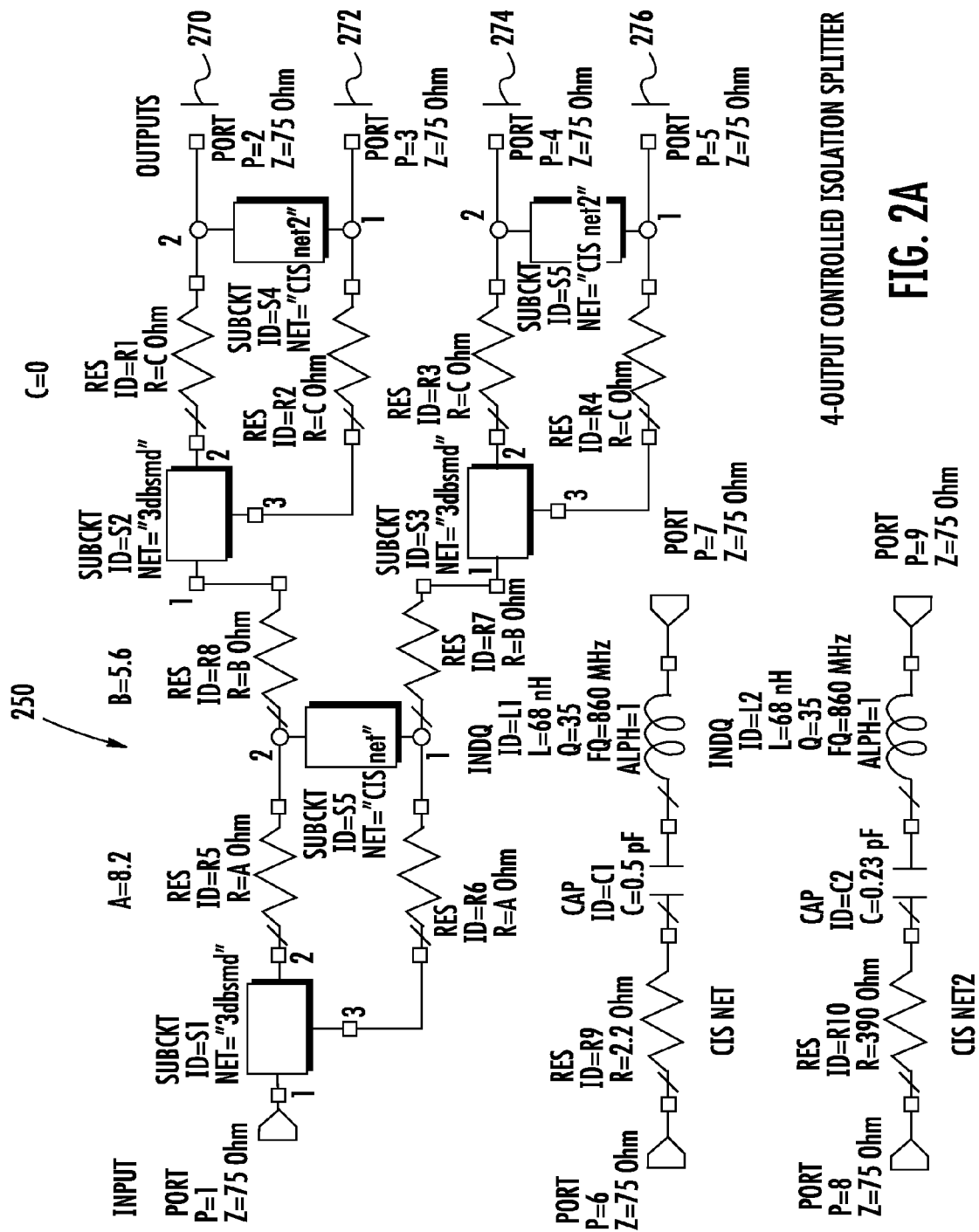
FIG. 2a is a schematic diagram of an exemplary cascaded configuration of the CIS according to the invention, having four (4) output ports.

FIG. 2a illustrates a second embodiment of the splitter circuit according to the invention. As can be appreciated by those of ordinary skill, the 2-output CIS splitter circuit 200 previously described can serve as the basic building block for creating multiple output splitters with controlled isolation. In essence, these building blocks can be arranged in a multi-staged or cascaded fashion. Since the splitters preceding a given stage in the cascade affect the subsequent splitters feeding the outputs, the component values in the bypass networks are typically different in each stage. In addition, resistance must be added in the main signal paths to maintain the correct impedance at all ports.

In the embodiment of FIG. 2a, the circuit 250 comprises three (3) cascaded two-output circuits each having two (2) outputs, thereby forming a total of four (4) output nodes 270, 272, 274, 276. This four-output arrangement allows signal communication, inter alia, between the two output nodes of the second-stage splitters, with all of the attendant benefits of the circuit 200 of FIG. 2. It will be appreciated that this configuration can be scaled to any number of output ports, including both even and odd numbers thereof. In practice, however, a 2-output CIS splitter is sufficient for most subscriber installations. A CIS splitter is always associated with the signal path of the server device. A multiport CIS splitter having 3 or 4 ports (e.g., of the type shown in FIG. 2a) is anticipated for integration with an interface device that contains a high isolation amplifier, a high-pass or band-stop filter in the reverse diplex path, and a CIS splitter array serving a plurality of outputs of the device (usually 2, 3, or 4).

It will also be noted that the bypass component values will change for networks associated with CIS splitters that are closer to the input of such multiport devices.

It will also be recognized that electrical equivalents of the circuits 200, 250 shown in FIGS. 2 and 2a may be utilized. For example, a resistor of a given resistance value may be replaced by two series resistors of ½ that value (since series resistors add their resistance). Similarly, other types and combinations of components that provide the desired functionality disclosed herein, and/or add additional desired functionality, may be used consistent with the invention, including for example varistors, field effect transistors (FETs), and diodes. Other signal conditioning and/or filtration may also be desired, such as where differential and/or common mode noise are filtered using inductive reactors (e.g., choke coils), etc.

It will also be appreciated that the circuits of FIGS. 2 and 2a may be rendered in literally any physical form, including without limitation: (i) as a circuit composed of discrete circuit elements (i.e., resistors, capacitors and inductors); (ii) as an integrated circuit, either in a stand-alone form factor or integrated with other circuits/functions; and (iii) physically integrated with a parent device (in either of the foregoing forms), such as with a DTSB or demarcation point device. Myriad different configurations will be recognized by those of ordinary skill given the present disclosure.

FIG. 3a is a graphical representation of the electrical performance of a typical prior art passive splitter circuit. Note the comparatively high attenuation in the 800-1000 MHz band. The various trace designations (e.g., S(x,y) of FIG. 3a refer to port exit/entry designation. For example, S(1,1) means the signal exits and enters port one (1), and hence a reflection. Use of different numbers signifies a transmission from one port to another.

FIG. 3b is a graphical representation of the electrical performance of the exemplary CIS circuit 200 of FIG. 2, showing the change in isolation (attenuation) between 800 and 1000 MHz. In the illustrated embodiment, the circuit 200 provides reduced isolation of approximately 10 dB across this band (equating to more than eight times the signal power of that passed using a prior art splitter device). Enhanced isolation is also provided within the aforementioned 5-40 MHz range as well, inter alia, to accommodate the comparatively high cable modem transmit levels.

FIG. 3b also illustrates elimination of the broad notch between approximately 150 MHz and 300 MHz. The traces of FIGS. 3a and 3b identified as S(1,1) comprise the input return loss under the prior art and exemplary embodiments, respectively. The presence (or absence) of a notch in these traces is due to the fact that the impedance at these frequencies is moving closer to the ideal impedance (e.g., 75 ohms in the exemplary coaxial cable network). The presence of the bypass components in the CIS splitter circuit (FIG. 3b) alter the input impedance slightly in this band so the notch disappears. The return loss trace becomes increasingly sensitive to variations in impedance as the impedance of the device approaches a "perfect" 75 ohms. Specifically, Return Loss can be quantified according to Eqn. (1):

$$RL = 20 \text{ LOG } [(Z_1+Z_0)/(Z_1-Z_0)] \quad \text{Eqn. (1)}$$

where $Z_0$ is the 75 ohm reference impedance.

Figure 3C:
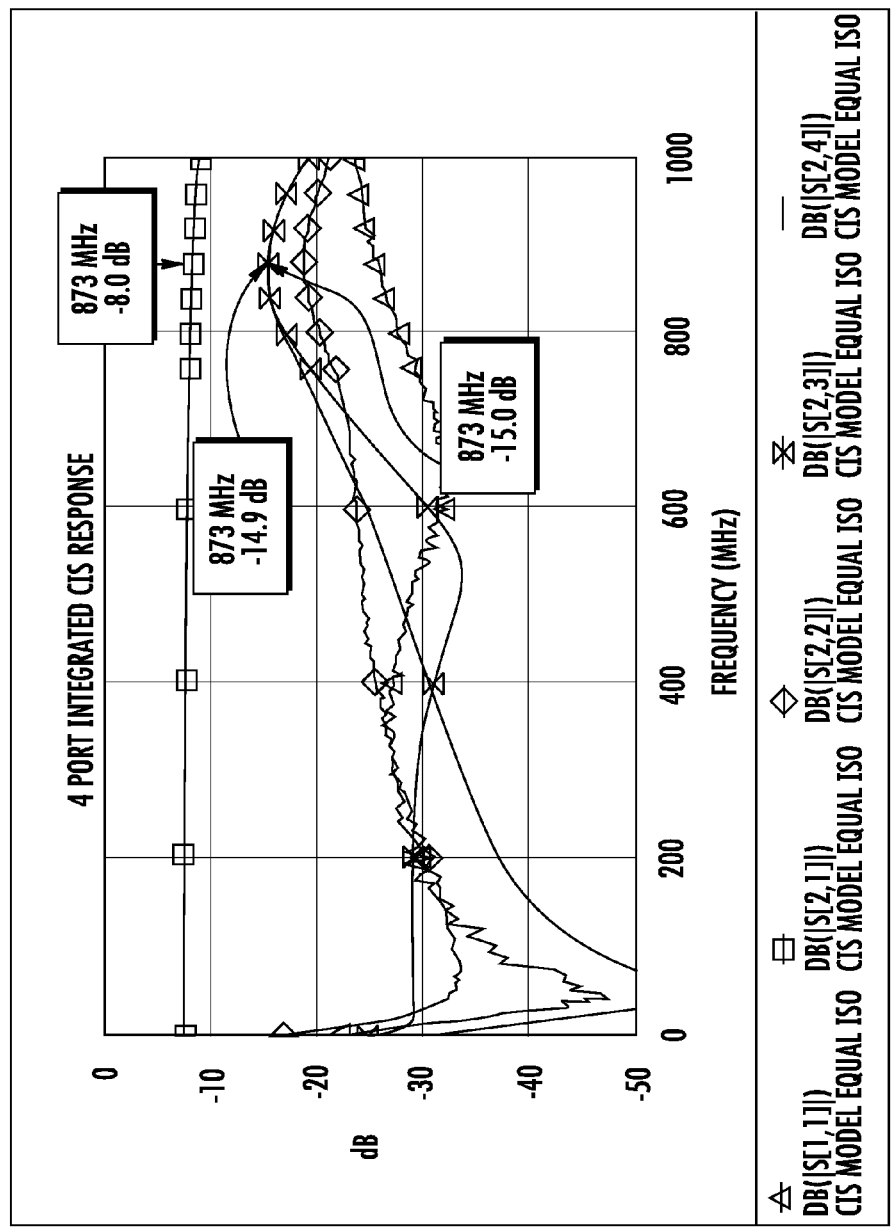

FIG. 3c illustrates the response of the exemplary four-port variant of the circuit 250 of FIG. 2a.

One further advantage provided by the present invention(s) relates to the elimination of destructive interference within the premises "network". Specifically, under the prior art, with more than one signal path, signals tend to bounce off of any installed reflector and sometimes generate destructive interference. The presence of such destructive interference can be significantly impacted by the wiring dimensions and patterns within a given premises, sometimes necessitating partial or complete rewiring. Conversely, under the present invention, these destructive interference issues are greatly mitigated, since intra-premises signals can propagate through the premises splitters 200, the signals only being reflected by the splitter at the entry point of the premises (see discussion of the optional reflector circuit below).

Figure 4:
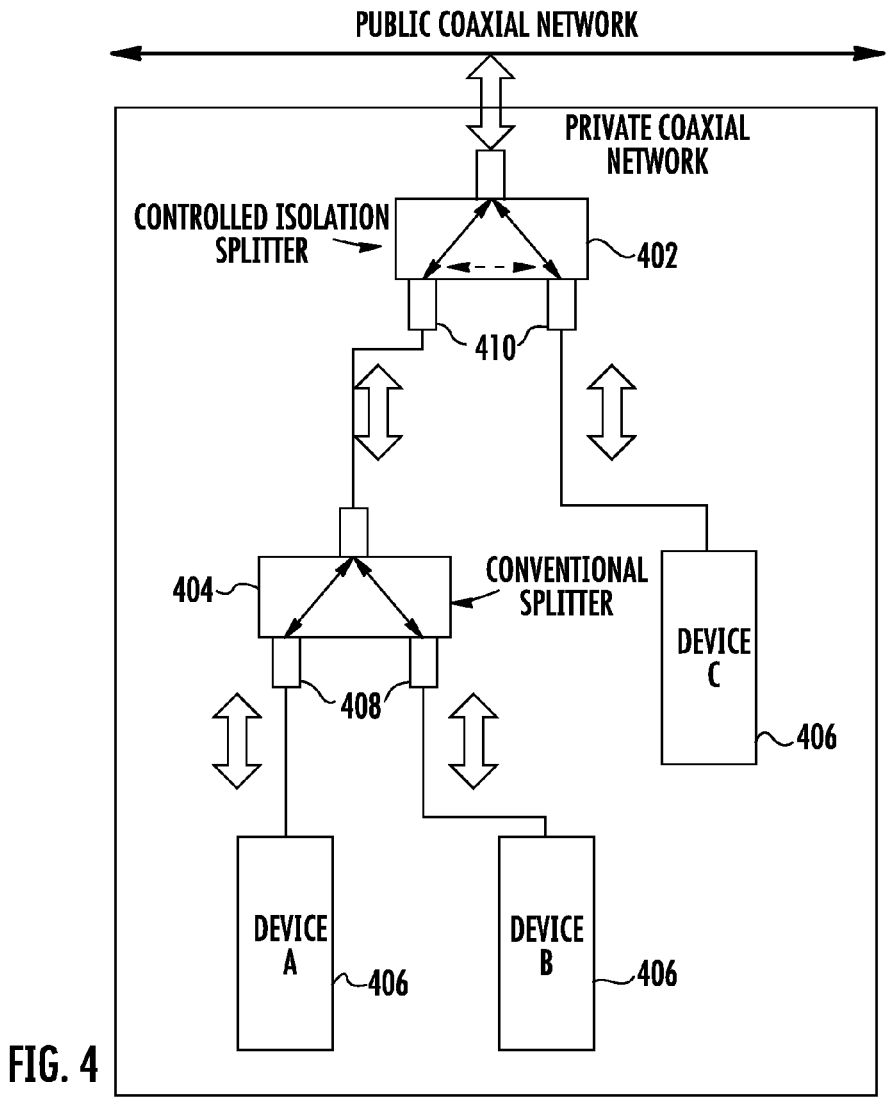
FIG. 4 is a functional block diagram illustrating a first exemplary configuration of the CIS of the invention installed at a premises along with a prior art splitter.

FIG. 4 illustrates an exemplary application of the Controlled Isolation Splitter circuit 200 in the form of a premises-side device 402 (e.g., in a private coaxial network such as a CATV subscriber residence). This Figure illustrates the difference between the CIS 402 and a conventional splitter 404. Devices A, B, and C 406 shown in FIG. 4 can either be clients or servers (or even other devices) on the private coaxial network. These devices can communicate in one or more designated frequency bands, such as e.g., between 800 and 1200 MHz or any other bands of reduced isolation designed into the splitter circuit(s) 200.

In the network of FIG. 4, consider a first case where Device A comprises a server, and Devices B and C clients. Device A cannot communicate with Device B, since the conventional splitter 404 has a high degree of attenuation between its output ports 408. However, Devices A and C can communicate, since signal can pass through the output port of the conventional splitter 404 and between the output ports 410 of the CIS 402.

Considering now a second case where Devices A and B comprise clients, and Device C is a server, Device C can communicate with A and B, since the CIS 402 allows communication between its output ports 410.

Figure 4A:
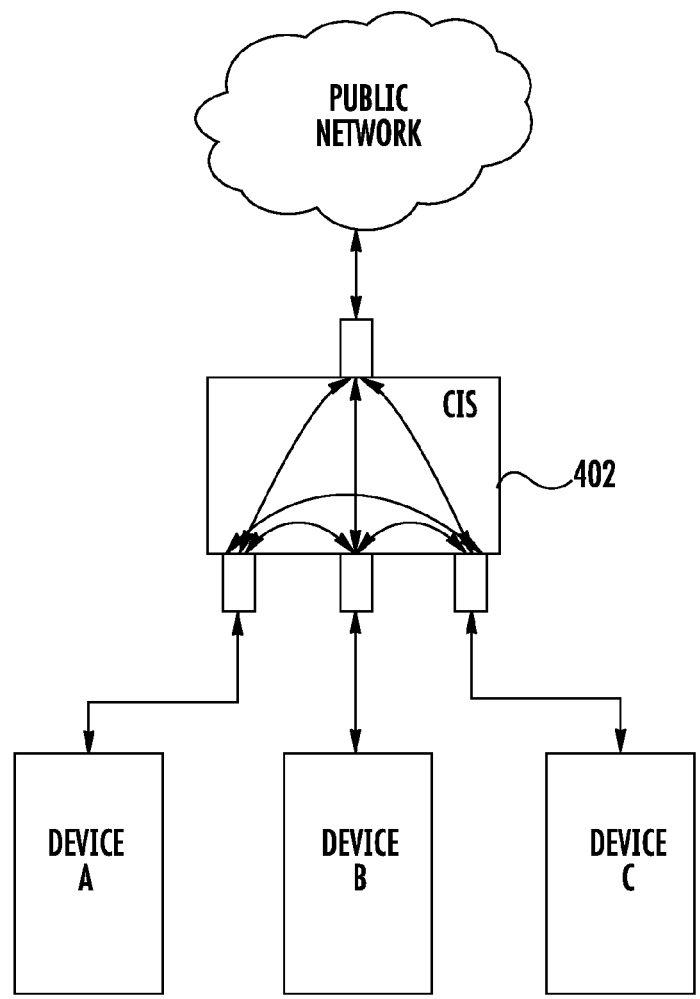
FIG. 4a is a functional block diagram illustrating a second exemplary embodiment of the CIS of the invention installed at a premises in a stand-alone configuration.
Figure 4B:
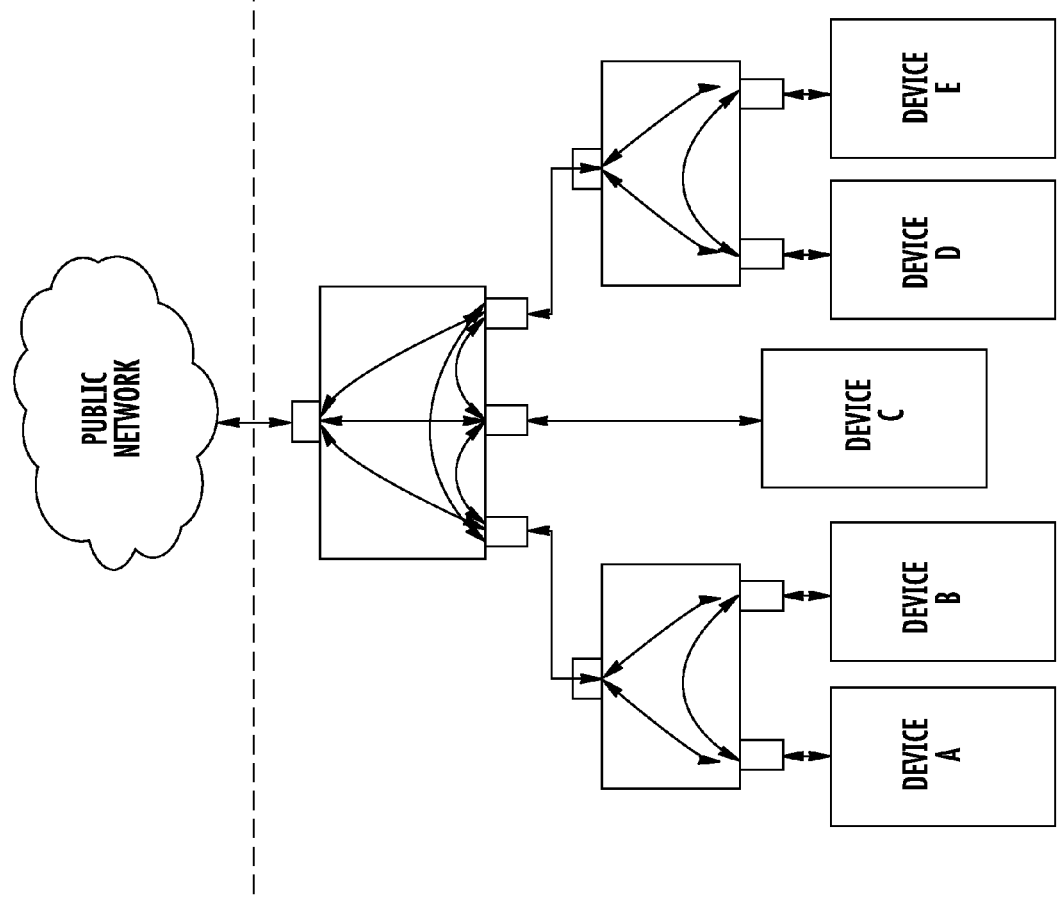
FIG. 4b is a functional block diagram illustrating a third exemplary embodiment of the CIS of the invention installed at a single premises in a cascaded configuration.
Figure 4C:
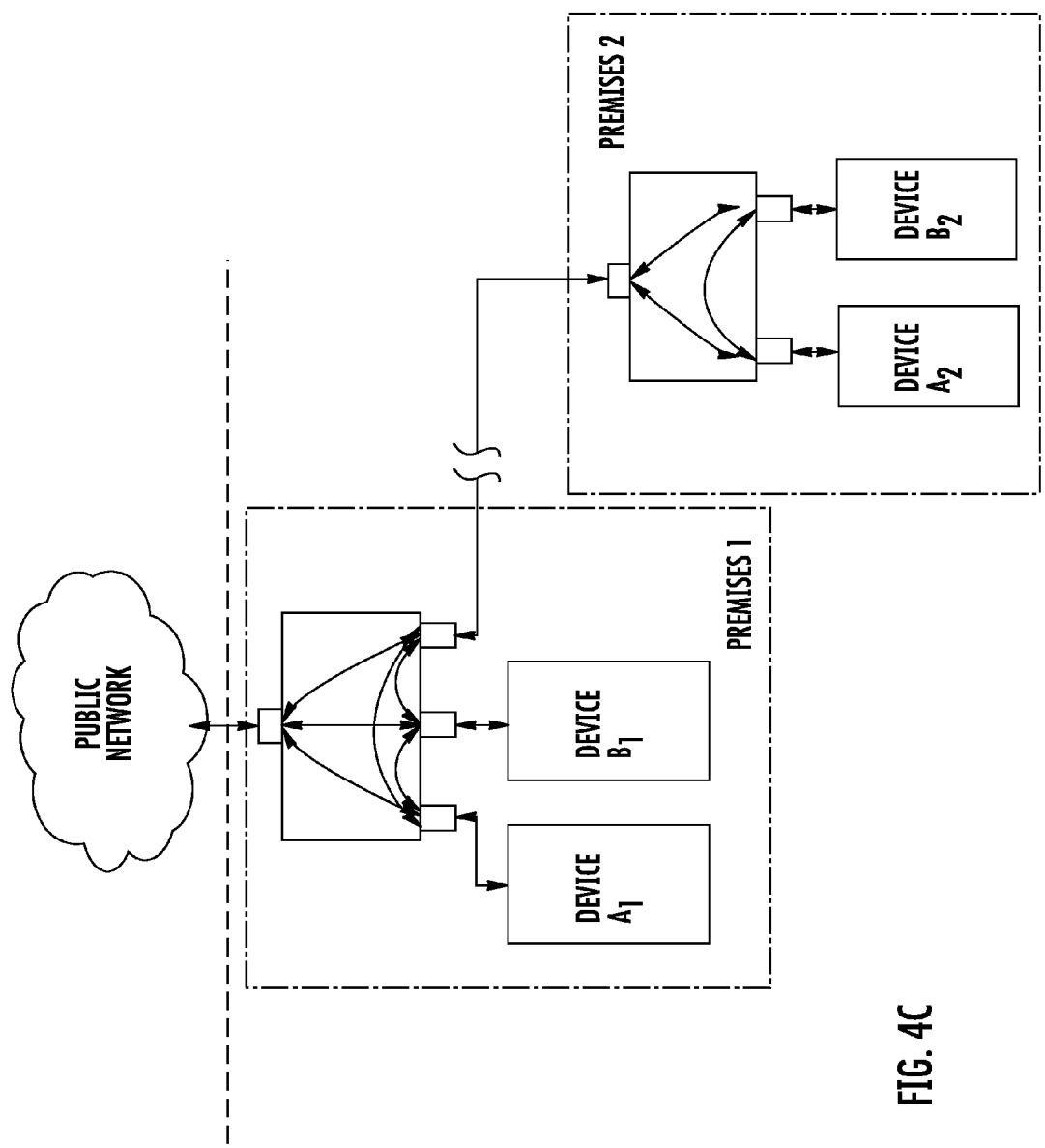
FIG. 4c is a functional block diagram illustrating a fourth exemplary embodiment of the CIS of the invention installed at multiple premises in cascaded configuration.

It will be recognized that the CIS 402 can be used in a stand-alone configuration (FIG. 4a), allowing multiple client/server devices to communicate between its plurality of output ports. Alternatively, multiple CIS devices can be cascaded at the premises (FIG. 4b) or between multiple premises (FIG. 4c) so as to allow unimpeded communication without "leakage" of the communicated premises signals back onto the bearer network or its agents.

As yet another alternative, the CIS circuit 200 can be used in the same device along with a prior art splitter, thereby providing the subscriber with a heterogeneous capacity all in one device. This configuration may be useful, for example, where an architecture of the type shown in FIG. 4 is used. In one variant, a single splitter (physical) device is provided, with the "cascaded" arrangement of FIG. 4 built in so that the user is provided only four ports: (i) the input port; (ii) two high-isolation ports 408 (associated with the output of the conventional splitter circuit); and (iii) a single low or controlled isolation port 410. Alternatively, the subscriber can be given greater configuration flexibility, such as where two CIS ports 410 are provided, as well as two conventional splitter ports 408 and input ports for both the CIS and conventional splitter. The subscriber can then "jumper" one of the CIS ports 410 to the input of the conventional splitter if desired to provide the configuration of FIG. 4, or alternatively configure in other ways. Along these lines, the splitter chassis (not shown) may be made modular, to permit the selective addition or change-out of splitter devices of both kinds.

Figure 4D:
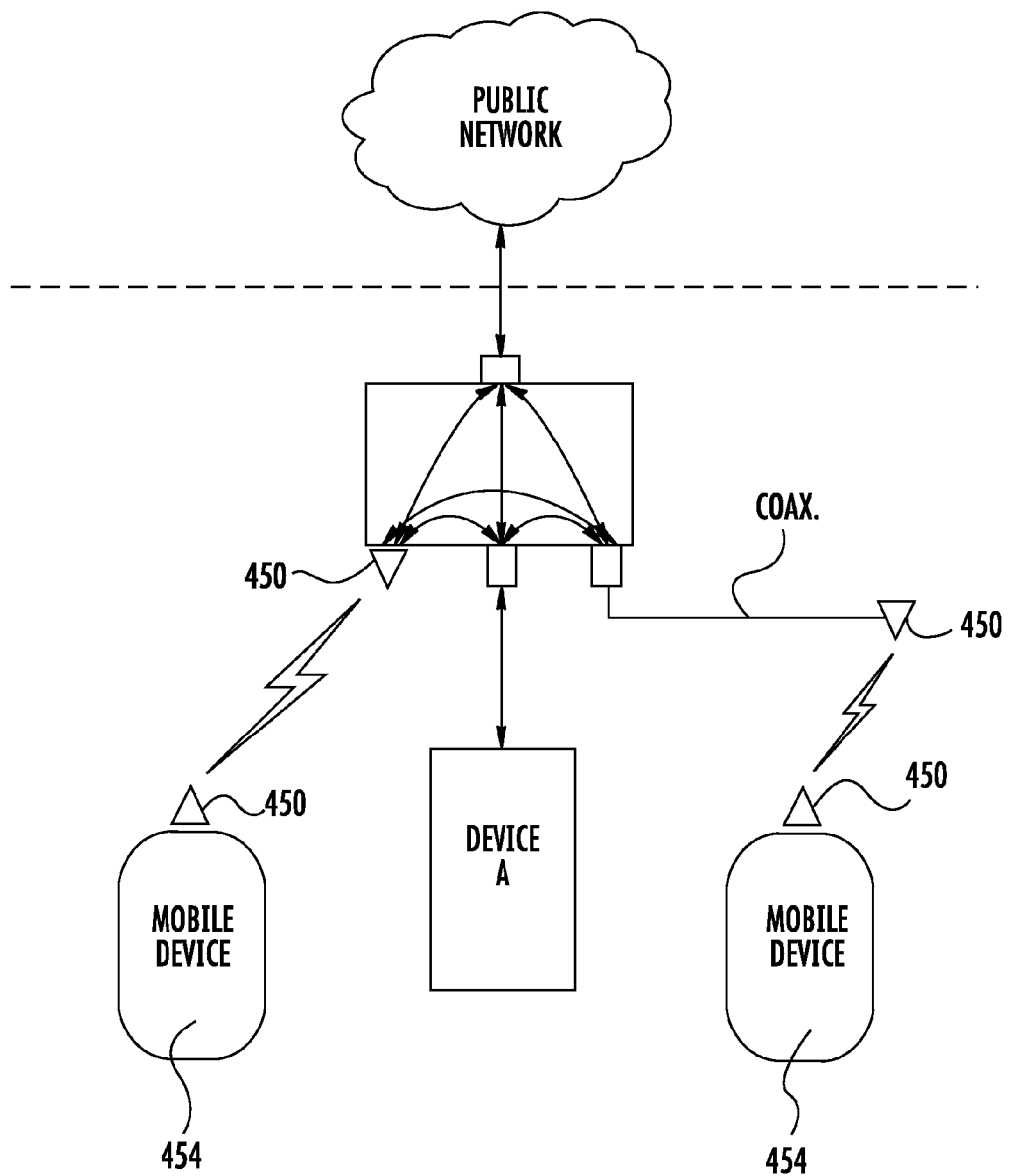
FIG. 4d is a functional block diagram illustrating a fifth exemplary embodiment of the CIS invention installed at a premises incorporating one or more wireless interfaces.

Furthermore, the splitter devices described herein need not necessarily be used in a completely "wired" network premises. For example, as shown in FIG. 4d, wireless transceivers 450 can be placed within the premises, after the splitting of the incoming signals has occurred. The wireless transceivers 450 act as two-way signal interfaces between the mobile devices 454 and the CIS. Signal splitting and reflection within the CIS proceeds as previously described; however, instead of being distributed over a coaxial cable to the client devices, the signals are distributed over at least a portion of the signal path via a wireless transmission such as an 802.11 interface, 802.15 UWB interface, infrared (e.g., IrDA) interface, or any number of other wireless modalities now ubiquitous in the data networking arts. Note that the transceiver device associated with the CIS may be mounted directly on the CIS (such as plugging a module into one of the existing splitter ports), or alternatively may be disposed at the distal end of the installed premises coaxial cable, such as on the wall jack associated with the coaxial cable. The transceiver of the CIS converts between the wired and wireless domains using well understood technology, while the transceiver of the mobile devices 454 converts between the wireless domain and the internal data environment of the mobile device. The mobile devices can include literally any type of device, including without limitation laptop computers or PCs, handhelds or notebooks, cellular telephones, PDAs, set-tops, gaming consoles, or even remote control units.

It will be appreciated that the Controlled Isolation Splitter (CIS) of the present invention can be used for a number of different applications, including (without limitation): (i) one-way (unidirectional) communications within passive broadband coaxial networks; and (ii) two-way (bidirectional) communications within such networks.

For one-way communications, the CIS enables such communications from one connected terminal device to another as long as there are no amplifiers present (i.e., the network devices are passive). The communicated payload may comprise literally any signal modulated at the frequency of controlled isolation, including e.g., video, audio, or data. The principal advantage of using the exemplary CIS in this application is that since there are no filters, the CIS does not interfere with normal functioning of the passive portion of the broadband coaxial distribution network.

Different methods of two-way communication are possible using only CIS devices. For example, a time-division multiple access (TDMA) approach of the type well known in the RF arts may be used wherein the different devices effectively "take turns" using the communications channel according to a programmed series of time slots which are assigned to the devices. As another alternative, a direct-sequence or code-division multiple access (CDMA) approach may be used, wherein multiple devices can simultaneously access the relevant spectral band or bands according to a randomized or pseudo-randomized spreading code. As yet another option, a frequency division multiple access (FDMA) approach may be used, wherein a plurality of discrete frequency bands within the larger spectral band(s) are assigned on a permanent or variable basis to the devices. As still another approach, an orthogonal FDM (OFDM) approach may be used, wherein device communications are spread across a plurality of spread orthogonal frequency bands. As still a further alternative, a carrier sensed multiple access (CSMA) with or without collision detection (CSMA/CD) may be used to arbitrate access to one or more common carriers. As yet another alternative, an ALOHA spectral access approach may be used. As still another approach, a frequency hopped (FHSS) approach may be used, wherein logical channels are created across a plurality of predictably spaced carriers which are hopped in the time domain according to a predetermined hop sequence. Other spectral access techniques may also be used consistent with the invention, as will be appreciated by those of ordinary skill in the art.

Alternatively, one or more separate channels for "backchannel" communications may be used in a two-way service. For example, multi-room video distribution within the home may be provided, wherein the backchannel is facilitated by the reflector device described in greater detail subsequently herein. Such applications can be realized in private broadband passive coaxial networks within homes or businesses, such as master antenna networks as well as in CATV networks. The passive broadband coaxial network may be, for example, within a home or business, or between multiple homes or businesses wherever a "tree" type network topology is utilized.

CIS and High-Pass Reflector with Blocking Provisions

In one embodiment, the CIS circuit of the invention is used in conjunction with one or more filter/reflector circuits, for example those of the type described in co-owned and co-pending U.S. patent application Ser. No. 11/143,120 entitled "APPARATUS AND METHODS FOR NETWORK INTERFACE AND SPECTRUM MANAGEMENT" filed contemporaneously herewith, and previously incorporated herein by reference. This filter/reflector apparatus makes use of one or more filters designed to strongly reflect signal frequencies at the lower end of the CATV reverse band, while simultaneously allowing the rest of the reverse band and the entire forward band to pass freely through the device. This selective filtering of the spectrum allows control signals generated within a private network to be directed (by reflection) to other devices within that network. Since these signal frequencies are not allowed to pass through the filter, they do not enter the public CATV network. However, it is desirable to pass DC or AC power through the high-pass reflector.

The high-pass reflector with blocking capability of the exemplary embodiment comprises the combination of an isolation amplifier and a high-pass reflector, although it will be recognized that other combinations of components may be used to provide the same or similar functionality. The high-pass reflector can be built into a diplex filter of the amplifier circuit, or it can be added externally to the output of a commercial subscriber amplifier. Most subscriber amplifiers are powered either through a separate power port or through the output port. Since the high-pass reflector can also pass power, the amplifier output port can advantageously be powered through the high-pass filter if desired.

As will be appreciated by those of ordinary skill, numerous possible applications of the reflector device described herein exist in both one-way and two-way passive broadband coaxial networks. The reflector performs all of the CIS functions previously described herein, and can be used in the same applications. However, the reflector blocks signals in the reflected frequency band and therefore prevents the use of these frequencies and the associated services across the reflector. Reflectors also introduce the opportunity for multiple transmission paths within the reflected portion of the network. For this reason, they are of less value at high frequencies when rapid symbol rates are needed (such as in digital video) because of the potential for signal cancellation in certain network configurations.

It will also be appreciated that the CIS and reflector devices described herein may be integrated with other types of components, whether related to the content-based network over which the content or services are provided, or otherwise. For example, these device may be integrated with one or more of the set-top boxes or other CPE devices within the given premises, or alternatively within an MHP-compliant satellite receiver unit of the type well known in the art. The splitter/reflector devices may also be integrated with a display device as well or in the alternative, so as to provide an "all-in-one" type form factor to the consumer.

Due to their virtual "transparency" to signals within the prescribed bands, The splitter/reflector can also advantageously be used in conjunction with (and without interfering with) existing CPE configurations without any modification thereof. The splitter/reflector are also transparent to other functions resident in the CPE operating at the software layer, such as for example the hardware registry described in co-owned and co-pending U.S. patent application Ser. No. 10/723,959 filed Nov. 24, 2003 and entitled "METHODS AND APPARATUS FOR HARDWARE REGISTRATION IN A NETWORK DEVICE", the error logging functionality described in co-owned and co-pending U.S. patent application Ser. No. 10/722,206 filed Nov. 24, 2003 and entitled "METHODS AND APPARATUS FOR EVENT LOGGING IN AN INFORMATION NETWORK", and the display element management functionality described in co-owned and co-pending U.S. patent application Ser. No. 10/773,664 filed Feb. 6, 2004 and entitled "METHODS AND APPARATUS FOR DISPLAY ELEMENT MANAGEMENT IN AN INFORMATION NETWORK", each incorporated herein by reference in their entirety.

Similarly, the CIS and reflector devices described herein can advantageously be used with literally any topology of bearer network, such as for example a conventional HFC topology, or alternatively the multi-server architecture described in co-pending and co-owned U.S. patent application Publication No. 20020059619 to Lebar published May 16, 2002 and entitled "Hybrid central/distributed VOD system with tiered content structure" which is incorporated herein by reference in its entirety.

It will further be recognized that the components of the CIS and reflector circuits of the present invention can be made variable, and/or multiple components or circuits utilized in parallel in order to selectively (or non-selectively) provide two or more accessible frequency bands. For example, in one variant, the splitter and reflector devices are configured to provide two discrete non-adjacent frequency bands for use within the premises, wherein multiple devices can communicate via the different bands simultaneously (akin to an FDMA approach). Alternatively, the splitter and reflector can be made "tunable", such that an installation technician, head-end supervisory process via computer program(s), or even the customer themselves can adjust the frequency spectrum window(s) either at installation or even during operation. The splitter can even be made self-configuring, roughly akin to well-known "zero-configuration" network devices which self install by obtaining an appropriate IP address at time of installation. The distinction in the present context might comprise, for example, sensing the presence of carrier or other signal within a given frequency band, and then self-tuning the CIS/reflector according to a tuning algorithm or program in order to operate in an unused portion of the spectrum.

It is also noted that other economic advantages are provided by the CIS/reflector apparatus of the present invention. Specifically, by structuring these devices as described herein, significant reductions in manufacturing cost can be realized, largely due to the fact that less precision is required. For example, rather than having to construct a precision filter circuit (which includes higher cost precision electronic components) to create notches or other desired artifacts within the response of the filter, the construction set forth herein lends itself to use of less precise and less costly components. Furthermore, the exemplary configurations described herein are less sensitive to variations in ambient temperature, such as may routinely occur in a user's premises. This reduced temperature sensitivity also allows for the use of lower cost components.

These filters can also be readily combined with the CIS circuitry within a single form factor that is even user-installable, as described below.

Business Models

Various business models and methods can also be employed consistent with the present invention. For example, in one aspect, the improved splitter (and optionally filter/reflector) devices are distributed with or installed as part of new subscriptions or upgrades. In one variant of this approach, the devices are integrated with the installed DSTB provided to the subscriber at inception. The DSTB may comprise, for example, the improved CIS previously described herein that provides desired isolation characteristics across its output ports, while utilizing the filter/reflector circuit previously referenced to provide the desired forward/reverse band blocking and passing capabilities across the input to the DSTB. In this capacity, the DSTB can act as a networking hub of sorts within the subscriber's premises. Specifically, multiple output ports are provided to which multiple devices may be connected, such devices (and the low-impedance path from output port to output port) forming the basis for the aforementioned premises network 109.

Alternatively, the splitter/reflector devices can be configured as "add-on" parts that can be self-installed by the consumer at the premises, such by merely inserting the splitter (and filter/reflector) in-line between their DSTB and the coaxial cable ingress point from the public network.

The enhanced CIS (and filter/reflector) functionality can also be made selectively enabled, such as via downstream encrypted signaling or command from the head-end to the splitter or other associated equipment which causes the splitter/reflector to reconfigure (i.e., be placed in the circuit path, or tune appropriately), thereby enabling intra-premises communications as previously described. In-band or OOB downstream signaling channels may be used for this purpose, as well as other techniques and/or portions of the available frequency spectrum.

Such functionality could comprise a premium or incentive feature as well if desired, ideally increasing revenue. For example, the CIS device 402 shown in FIG. 4 can be selectively enabled so as to permit use of a premises network "hub" as previously described, whereas such functionality is not provided when the CIS is deactivated and operated merely as a conventional splitter.

In the context of content or high-speed data delivery, subscribers having extended frequency range tuners (i.e., those able to utilize the extra portion of the downstream frequency spectrum afforded by the reduced spectral blockage afforded by the enhanced filter/reflector) can be allocated additional frequency spectrum, or selectively be tuned to this portion of the spectrum, so as to maximize the performance of their components. Much as the well-known highway "car-pool" lane is reserved and left substantially unimpeded for drivers meeting certain criteria (i.e., two or more persons in the vehicle), the added spectrum provided by the present invention can be reserved for premium customers (or those meeting other criteria), and their filters/reflectors selectively activated to make use of this spectrum. Non-premium/non-qualifying subscribers would conversely not be given access, whether by not providing them with the enhanced filter/reflector, or alternatively by simply not enabling it (i.e., allowing them to only operate with a legacy filter/splitter that is also installed in their CPE/demarcation device).

The ability to selectively activate or deactivate the filter/reflector and/or splitter functions may also be used as the basis for a maintenance or other "special function" mode, wherein the MSO can selectively active the filter/reflector to provide enhanced frequency spectrum in support of testing, diagnostics, application download, etc.

In terms of installation, all that would be required of the subscriber (or other installer) would be to replace the existing (high isolation) splitter(s) with controlled isolation splitter(s) according to the invention. In fact, only those splitters located at points where a signal direction change is required need be replaced; the other existing splitters can remain since the reduced isolation afforded by the CIS is not required. The number of devices that need to be replaced will never exceed "one less than" the number of terminals or nodes with which networked communication is desired. For example, if the premises has two nodes that wish to communicate and a single splitter, the number of splitters required is 2−1=1.

As another example, consider the arrangement of FIG. 4, wherein if Devices C and A 406 are required to communicate, only one CIS is required (with the placement as shown in FIG. 4). Alternatively, if Devices A and B need to communicate, a CIS can be placed at the location of the conventional splitter 404. Placement of CIS devices at both locations 402, 404 would allow all three (3) stations to communicate using N−1 or 3−1=2 CIS devices.

It will be recognized that while certain aspects of the invention are described in terms of a specific sequence of steps of a method, these descriptions are only illustrative of the broader methods of the invention, and may be modified as required by the particular application. Certain steps may be rendered unnecessary or optional under certain circumstances. Additionally, certain steps or functionality may be added to the disclosed embodiments, or the order of performance of two or more steps permuted. All such variations are considered to be encompassed within the invention disclosed and claimed herein.

While the above detailed description has shown, described, and pointed out novel features of the invention as applied to various embodiments, it will be understood that various omissions, substitutions, and changes in the form and details of the device or process illustrated may be made by those skilled in the art without departing from the invention. The foregoing description is of the best mode presently contemplated of carrying out the invention. This description is in no way meant to be limiting, but rather should be taken as illustrative of the general principles of the invention. The scope of the invention should be determined with reference to the claims.

What is claimed is:

1. A network signal splitting apparatus, comprising:
at least one input port configured to receive an input signal from a network;
a splitting circuit operatively coupled with said at least one input port and configured to split said input signal;
at least three output ports operatively coupled with said splitting circuit, respective ones of said ports at least receiving portions of said split input signal; and
a signal bypass circuit electrically coupled to said at least three output ports and configured to pass signals of a certain frequency received at a first one of said at least three output ports only to a second one of said at least three output ports, said other ones of said at least three output ports not receiving said signals of a certain frequency;
wherein said at least three output ports are configured for signal communication with respective ones of at least three terminals.

2. The network signal splitting apparatus of claim 1, further comprising reflector apparatus configured to reflect at least a portion of radio frequency signals transmitted between said terminals, said reflector apparatus being disposed within said splitting apparatus so as not to interfere with said communications between said terminals.

3. The network signal splitting apparatus of claim 2, wherein one of at least one specified frequency band comprises approximately 800 MHz to 1200 MHz.

4. The network signal splitting apparatus of claim 2, wherein said reflector apparatus is configured to:
attenuate first signals within a first frequency band and traveling in a first direction relative to said splitting apparatus:
pass second signals within a second frequency band and traveling in said first direction; and
pass all of third signals within both said first and second frequency bands and traveling in a second direction relative to said splitting apparatus.

5. The network signal splitting apparatus of claim 1, wherein at least one of said plurality of output ports is in operative communication with a transceiver configured for transmission of a signal over at least a portion of a wireless network.

6. The network signal splitting apparatus of claim 1, wherein said signal bypass circuit comprises:
at least one capacitive element;
at least one inductive element; and
at least one resistive element.

7. The network signal splitting apparatus of claim 1, wherein said three or more output means are isolated from one another except over at least one specified frequency band specified by said bypass circuit.

8. A method of transmitting data signals over a network, comprising:
propagating a first data signal from a first device onto said network and to a first output port of a splitter;
propagating said first data signal to a second device on said network via a second output port of said splitter utilizing a first dedicated bypass circuit configured to pass said first data signal only between said first device and said second device; and
propagating a second data signal from said first device to a third device on said network via a third output port of said splitter utilizing a second dedicated bypass circuit configured to pass said second data signal only between said first device and said third device;
wherein said splitter is configured to provide reduced isolation loss between said second output port and said first output port, and said third output port and said first output port, in at least one frequency band; and
wherein said first data signal is received only at said second device, and said second data signal is received only at said third device.

9. The method of claim 8, further comprising reflecting at least a portion of signals disposed within said at least one frequency band using a reflector of said splitter.

10. The method of claim 8, wherein sending said first data signal over said network comprises sending said first signal at least partly over a wireless network.

11. The method of claim 10, wherein said at least one frequency band comprises approximately 800 MHz to 1200 MHz.

12. A network signal splitting apparatus, comprising:
at least one input means configured to receive an input signal from a network;
splitter means operatively coupled with said at least one input means for splitting said input signal;
a three or more output means operatively coupled with said splitter means, respective ones of said output means at least receiving portions of said split input signal for transmission to three or more respective ones of a plurality of terminals; and
bypass means configured to electrically couple said three or more output means to one another such that a separate bypass means is utilized to pair said three or more output means to each other one of said three or more output means;
wherein said three or more output means are isolated from one another except over at least one specified frequency band; and
wherein transmission of said split input signal from said three or more output means to respective ones of said plurality of terminals occurs via said bypass means, said terminals being able to communicate with one another over said at least one specified frequency band.

13. A signal splitting apparatus for use in providing communication between a plurality of devices in a customer premises network, said apparatus comprising:
an input port configured to receive a downstream signal from a content-based network;
a first output port configured to pass at least a portion of said downstream signal to a first customer device, wherein said first output port is further configured to receive an upstream communication from said first customer device;
a second output port configured to pass at east a portion of said downstream signal to a second signal splitting apparatus; and
a direct path between said first and said second output ports, said path causing said upstream communication from said customer device to be passed downstream to said second signal splitting apparatus without requiring reflection thereof;

wherein said second splitting apparatus comprises a second bypass circuit to pass said at least portion of said downstream signal and said upstream communication to a plurality of consumer devices associated therewith.

14. A network signal splitting apparatus for use in a communications network comprising a plurality of terminal device configured to receive data and content from a network headend and to communicate therebetween, said apparatus comprising:
- an input node for receiving said data and content from said network headend;
- a plurality of output nodes configured to:
    - provide said data an content from said network headend to said plurality of terminal devices; and
    - receive at least one upstream communication from a first one of said plurality of terminal devices to be distributed to a second one of said plurality of terminal devices; and
- a circuit comprising:
    - a first plurality of paths from said input node said plurality of output nodes; and
    - a second plurality of paths from first individual ones of said plurality of output nodes to second individual ones of said plurality of output nodes, said second plurality of paths connecting each of said plurality of output nodes to each other one of said plurality of output nodes;

wherein said second plurality of paths comprise non-reflective direct bypass paths providing communication between said plurality of terminal devices.

15. A unitary network signal splitting apparatus for use with one or more networks, comprising:
- at least one input port configured to receive an input signal from a network;
- a splitting circuit operatively coupled with said at least one input port and configured to split said input signal;
- at least three output ports operatively coupled with said splitting circuit, respective ones of said ports at least receiving portions of said split input signal; and
- a signal bypass circuit electrically coupled to said at least three output ports and configured to pass signals of a certain frequency received at a first one of said at least three output ports only to a second one of said at least three output ports, said other ones of said at least three output ports not receiving said signals of a certain frequency;
- wherein said at least three output ports are configured for signal communication with respective ones at least three terminals; and
- wherein said bypass circuit does not utilize reflection to provide communication between said at least three output ports.

* * * * *